United States Patent
Chang

(10) Patent No.: US 12,260,900 B2
(45) Date of Patent: Mar. 25, 2025

(54) IN-MEMORY COMPUTING CIRCUIT AND METHOD, AND SEMICONDUCTOR MEMORY

(71) Applicant: CHANGXIN MEMORY TECHNOLOGIES, INC., Hefei (CN)

(72) Inventor: Heng-Chia Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 170 days.

(21) Appl. No.: 18/166,435

(22) Filed: Feb. 8, 2023

(65) Prior Publication Data
US 2023/0420035 A1 Dec. 28, 2023

Related U.S. Application Data

(63) Continuation of application No. PCT/CN2022/105106, filed on Jul. 12, 2022.

(30) Foreign Application Priority Data

Jun. 24, 2022 (CN) .......................... 202210728768.5

(51) Int. Cl.
*G11C 11/4094* (2006.01)
*G11C 11/408* (2006.01)
*G11C 11/4091* (2006.01)

(52) U.S. Cl.
CPC ...... *G11C 11/4091* (2013.01); *G11C 11/4085* (2013.01); *G11C 11/4094* (2013.01)

(58) Field of Classification Search
CPC ............ G11C 11/4091; G11C 11/4085; G11C 11/4094; G11C 7/1039; G11C 2207/2245; G11C 11/4096; G11C 7/1006

(Continued)

(56) References Cited

U.S. PATENT DOCUMENTS 5,400,342 A * 3/1995 Matsumura ............ G11C 29/34
365/201
6,044,033 A * 3/2000 Jang ....................... G11C 16/26
365/230.03
(Continued)

FOREIGN PATENT DOCUMENTS

CN 111459552 A 7/2020
CN 111863071 A 10/2020
(Continued)

OTHER PUBLICATIONS

"Architecture, challenges, and trends in memory computing", Jan. 13, 2019, http://www.360doc.com/content/19/0113/19/54396214_808625005.shtml.
(Continued)

*Primary Examiner* — Michael T Tran
(74) *Attorney, Agent, or Firm* — Syncoda LLC; Feng Ma

(57) ABSTRACT

An in-memory computing circuit includes an initial computing circuit and a target computing circuit. Herein, the initial computing circuit is configured to perform first operation processing on first data and second data to output a first operation result, and perform second operation processing on the first data and the second data to output a second operation result. The target computing circuit is configured to perform the first operation processing on the second operation result and the first operation result to output a first target result, and perform the second operation processing on the first data and the second operation result to output a second target result.

18 Claims, 17 Drawing Sheets

(58) Field of Classification Search
USPC .................................. 365/185.21, 185.24
See application file for complete search history.

(56) References Cited

U.S. PATENT DOCUMENTS

| | | | | |
|---|---|---|---|---|
| 6,298,459 | B1* | 10/2001 | Tsukamoto | H03M 13/47 341/158 |
| 6,839,256 | B1* | 1/2005 | Proebsting | G11C 15/00 365/49.16 |
| 7,050,317 | B1* | 5/2006 | Lien | G11C 15/00 365/49.1 |
| 8,787,086 | B1* | 7/2014 | Clark | G11C 8/10 365/185.11 |
| 9,953,726 | B1* | 4/2018 | Irby | G11C 13/0069 |
| 10,073,733 | B1* | 9/2018 | Jain | G06F 11/1044 |
| 10,877,731 | B1* | 12/2020 | Shu | G11C 8/16 |
| 10,930,341 | B1* | 2/2021 | Shu | G11C 7/18 |
| 2002/0017923 | A1* | 2/2002 | Kanetani | G11C 8/10 326/105 |
| 2003/0086314 | A1* | 5/2003 | Okazawa | G11C 7/1006 365/200 |
| 2006/0265440 | A1* | 11/2006 | Kaiser | G11C 7/225 708/190 |
| 2009/0086553 | A1* | 4/2009 | Lee | G11C 7/1048 365/194 |
| 2011/0211407 | A1* | 9/2011 | Chou | G11C 7/12 365/207 |
| 2017/0109308 | A1* | 4/2017 | Kim | G06F 13/161 |
| 2017/0301667 | A1* | 10/2017 | Or-Bach | H03K 19/17728 |
| 2018/0018219 | A1* | 1/2018 | Kim | G06F 11/106 |
| 2018/0069534 | A1* | 3/2018 | Sugahara | H03K 3/02337 |
| 2018/0174636 | A1* | 6/2018 | Jeon | G11C 7/1087 |
| 2018/0374519 | A1* | 12/2018 | Goel | G11C 7/18 |
| 2020/0051603 | A1* | 2/2020 | Kitagawa | G11C 7/1096 |
| 2020/0111523 | A1* | 4/2020 | Lee | G11C 11/4076 |
| 2020/0335146 | A1* | 10/2020 | Alrod | G11C 16/26 |
| 2020/0411091 | A1* | 12/2020 | Hwang | G06N 3/065 |
| 2021/0098057 | A1* | 4/2021 | Jung | G11C 29/32 |
| 2021/0174844 | A1* | 6/2021 | Choi | G11C 16/24 |
| 2021/0263673 | A1* | 8/2021 | Norman | G11C 5/025 |
| 2021/0327495 | A1 | 10/2021 | Patil et al. | |

FOREIGN PATENT DOCUMENTS

| | | |
|---|---|---|
| CN | 113345484 A | 9/2021 |
| CN | 113419705 A | 9/2021 |

OTHER PUBLICATIONS

"In-memory computing, a new paradigm for next generation computing?", Dec. 10, 2018, https://blog.csdn.net/rs62520kv/article/details/84949218.

"Memory part 2: CPU caches", Oct. 1, 2007, https://www.cnblogs.com/mikewolf2002/archive/2013/04/13/3017855.html.

* cited by examiner

IN-MEMORY COMPUTING CIRCUIT AND METHOD, AND SEMICONDUCTOR MEMORY

CROSS-REFERENCE TO RELATED APPLICATIONS

This is a continuation of International Application No. PCT/CN2022/105106 filed on Jul. 12, 2022, which claims priority to Chinese Patent Application No. 202210728768.5 filed on Jun. 24, 2022. The disclosures of the above-referenced applications are hereby incorporated by reference in their entirety.

BACKGROUND

At present, a computing/processing unit and a memory are two completely separate units in an architecture of a mainstream computer. The computing/processing unit reads data from the memory according to an instruction, and stores it back into the memory after computing/processing. However, since the improvement speed of performance of the computing/processing unit is faster than the development speed of performance of the memory unit, the read/write speed of the memory unit becomes an important bottleneck limiting the overall computer performance.

That is, during the operation on a large amount of data, the data need to be frequently moved between a processor and the memory, resulting in the problems of redundant operation time and loss of power consumption. In order to solve this problem, although the concept of in-memory computing has been proposed in recent years, there is still no unified solution for the specific implementation method of in-memory computing.

SUMMARY

The present disclosure relates to the technical field of semiconductor circuits, and in particular to, an in-memory computing circuit and method, and a semiconductor memory.

The embodiments of the present disclosure provide an in-memory computing circuit and method, and a semiconductor memory.

The technical solutions of the present disclosure are implemented as follows.

In a first aspect, the embodiments of the present disclosure provide an in-memory computing circuit, which includes: an initial computing circuit and a target computing circuit. The initial computing circuit is configured to perform first operation processing on first data and second data to output a first operation result, and perform second operation processing on the first data and the second data to output a second operation result. The target computing circuit is configured to perform the first operation processing on the second operation result and the first operation result to output a first target result, and perform the second operation processing on the first data and the second operation result to output a second target result.

In a second aspect, the embodiments of the present disclosure provide an in-memory computing method, which is applied to an in-memory computing circuit. The in-memory computing circuit includes an initial computing circuit and a target computing circuit. The method includes the following steps. The initial computing circuit performs first operation processing on first data and second data to output a first operation result, and performs second operation processing on the first data and the second data to output a second operation result. The target computing circuit performs the first operation processing on the second operation result and the first operation result to output a first target result, and performs the second operation processing on the first data and the second operation result to output a second target result.

DETAILED DESCRIPTION

Figure 1:
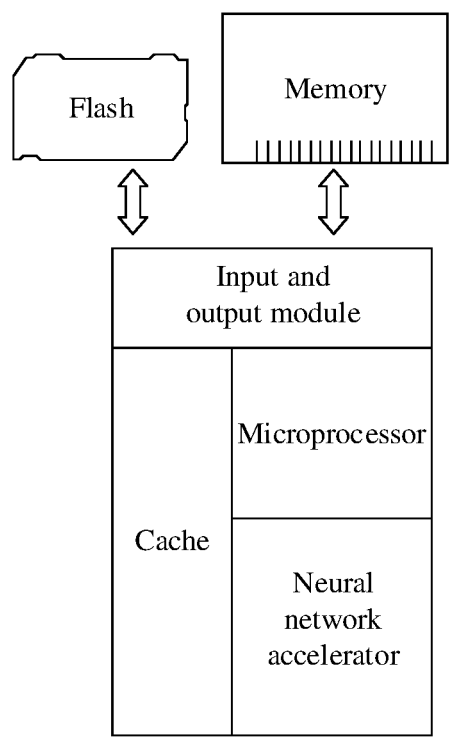
FIG. 1 is a first schematic diagram of compositions of a computer architecture.

The technical solutions in the embodiments of the present disclosure will be clearly and completely described in conjunction with the drawings in the embodiments of the present disclosure. It should be understood that that the specific embodiments described herein are only used to illustrate the relevant disclosure, but are not intended to limit the disclosure. In addition, it is to be noted that, for the convenience of description, only the parts related to the relevant disclosure are shown in the drawings.

Unless otherwise defined, all technical and scientific terms used herein have the same meaning as commonly understood by those skilled in the art of the present disclosure. The terms used herein are only for the purpose of describing the embodiments of the present disclosure and are not intended to limit the present disclosure.

In the following description, reference is made to "some embodiments" which describe a subset of all possible embodiments, but it should be understood that "some embodiments" may be the same or different subsets of all possible embodiments, and may be combined with each other without conflict.

It is to be noted that the terms "first\second\third" involved in the embodiments of the present disclosure are only used to distinguish similar objects, and do not represent a specific order of the objects. The specific order or sequence of "first\second\third" may be interchangeable under the allowable circumstances, so that the embodiments of the disclosure described herein may be implemented in an order except for those illustrated or described herein.

The von Neumann architecture is a classic structure of a computer, and is also a mainstream architecture of the current computer and processor chip. Referring to FIG. 1, which shows a first schematic diagram of compositions of a computer architecture. As shown in FIG. 1, the von Neumann architecture includes a memory unit (including a memory, a flash memory, etc.) and computing/processing units (including a neural network accelerator, a cache, a microprocessor, an input/output module, etc.). In the classic von Neumann architecture, the computing/processing unit and the memory unit are two completely separate units. The computing/processing unit reads data from the memory unit according to an instruction, completes computing/processing in the computing/processing unit, and stores the data back into the memory unit.

However, since the improvement speed of performance of the computing/processing unit is faster than the development speed of performance of the memory unit, the read/write speed of the memory unit becomes an important bottleneck limiting the overall computer performance. The energy consumed by reading and writing 32-bit data at a time by the current Dynamic Random Access Memory (DRAM) is two to three orders of magnitude more than the energy consumed by 32-bit data computing, which becomes the energy efficiency bottleneck in the overall computing device. In order to solve the problem, the concept of in-memory computing (or called in-memory operation) is proposed.

The main improvement of in-memory computing is that computing is embedded into the memory unit, the memory unit becomes a powerful tool for storage and computing, and the operation is completed while the data is stored/read, thereby reducing the cost of data access in the computing process. The computing is converted into weight and computing, and the weight is stored into the memory unit, so that the memory unit has computing power.

Figure 2:
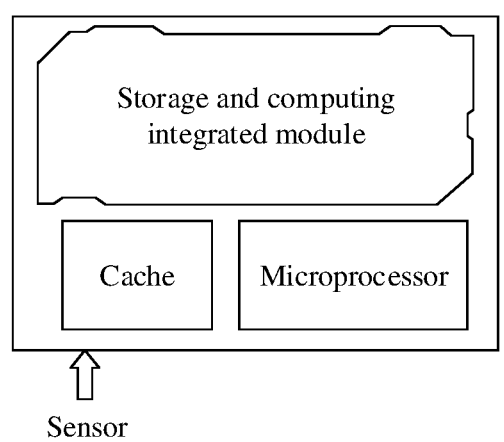
FIG. 2 is a second schematic diagram of compositions of a computer architecture.

In order to realize in-memory computing, additional storage area and a new computer architecture are needed, referring to FIG. 2, which shows a second schematic diagram of compositions of a computer architecture. As shown in FIG. 2, the architecture includes a storage-computing integrated module, a microprocessor and a cache, and the cache is connected with other components through sensors. It may be seen from FIG. 1 and FIG. 2 that the integration of storage and computing also needs a large amount of additional area, and the computer architecture is greatly changed, which leads to high implementation cost of in-memory computing and limits the development of in-memory computing.

Based on this, the embodiments of the present disclosure provide an in-memory computing circuit, which includes: an initial computing circuit and a target computing circuit. Herein, the initial computing circuit is configured to perform first operation processing on first data and second data to output a first operation result, and perform second operation processing on the first data and the second data to output a second operation result. The target computing circuit is configured to perform the first operation processing on the second operation result and the first operation result to output a first target result, and perform the second operation processing on the first data and the second operation result to output a second target result. Herein, the first target result is configured to indicate a result of XOR operation of the first data and the second data, and the second target result is configured to indicate a result of AND operation of the first data and the second data. In this way, the in-memory computing circuit performs twice first operation processing and twice second operation processing on the first data and the second data to obtain the result of XOR operation and the result of AND operation of the first data and the second data, and obtain the operation effect equivalent to that of the half adder, thereby improving the data processing speed through the in-memory computing circuit.

The embodiments of the present disclosure will be described in detail below with reference to the accompanying drawings.

Figure 3:
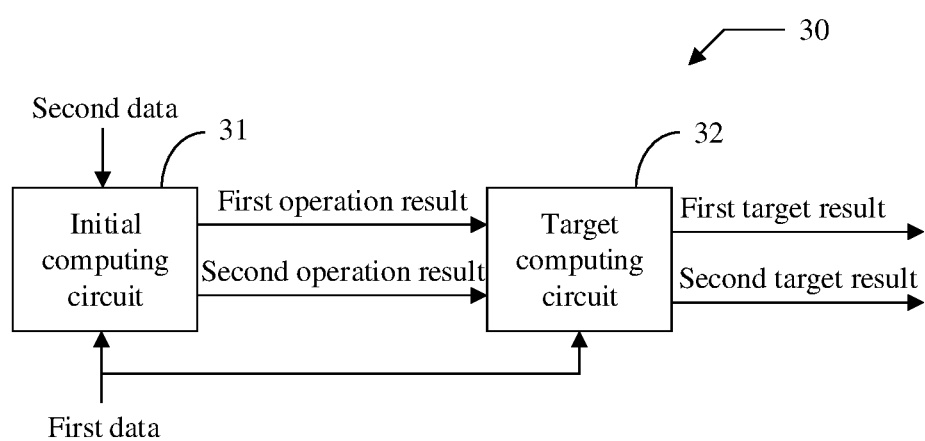
FIG. 3 is a schematic diagram of a composition structure of an in-memory computing circuit according to an embodiment of the present disclosure.

In an embodiment of the present disclosure, referring to FIG. 3, which shows a schematic diagram of compositions o an in-memory computing circuit 30 according to an embodiment of the present disclosure. As shown in FIG. 3, the in-memory computing circuit 30 may include: an initial computing circuit 31 and a target computing circuit 32.

The initial computing circuit 31 is configured to perform first operation processing on first data and second data to output a first operation result, and perform second operation processing on the first data and the second data to output a second operation result.

The target computing circuit 32 is configured to perform the first operation processing on the second operation result and the first operation result to output a first target result, and perform the second operation processing on the first data and the second operation result to output a second target result.

It is to be noted that the in-memory computing circuit 30 may be applied to a semiconductor memory, and may be applied to data operation under a computer architecture using the operation and characteristics of a memory array circuit of a memory (such as a DRAM). As shown in FIG. 3, the in-memory computing circuit 30 provided by the embodiment of the present disclosure may mainly include the initial computing circuit 31 and the target computing circuit 32. The first data and the second data represent original data needing to be computed. The initial computing circuit 31 processes the first data and the second data, so that two intermediate operation results, that is, the first operation result and the second operation result, may be obtained. The target computing circuit 32 processes the first data, the first operation result and the second operation result to obtain the final operation results, that is, the first target result and the second target result.

It is also to be noted that the function of a half adder may be realized based on the in-memory computing circuit 30. In the embodiment of the present disclosure, taking the half adder as an example, the first data represents a summand and the second data represents an addend in the half addition operation performed by the half adder.

Figure 4:
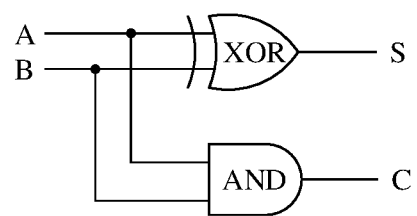
FIG. 4 is a schematic diagram of a principle of a half adder according to an embodiment of the present disclosure.

Referring to FIG. 4, which shows a schematic diagram of a principle of a half adder according to an embodiment of the present disclosure. The half adder is a device configured to implement the addition operation of two one-bit binary numbers. As shown in FIG. 4, the half adder has two input ends and two output ends, and consists of an XOR gate XOR and an AND gate AND. Herein, the two input ends are configured to input the summand A and the addend B respectively, and the two output ends are configured to output a sum S and a carry number C respectively. A truth table of the half adder is shown in Table 1.

TABLE 1

| Summand A | Addend B | Sum S | Carry number C |
|---|---|---|---|
| 0 | 0 | 0 | 0 |
| 0 | 1 | 1 | 0 |
| 1 | 0 | 1 | 0 |
| 1 | 1 | 0 | 1 |

That is, for the half adder, the input summand A and addend B are two one-bit binary numbers. The summand A and the addend B are subjected to XOR operation through the XOR gate XOR to obtain the sum S. The summand A and the addend B are subjected to AND operation through the AND gate AND to obtain the carry number C.

The in-memory computing circuit 30 shown in FIG. 3 may realize the function of the half adder. Herein, the first data represents the summand A, and the second data represents the addend B. After the first data and the second data are input into the initial computing circuit 31, the initial computing circuit 31 performs the first operation processing on the first data and the second data to output the first operation result. The initial computing circuit 31 also performs the second operation processing on the first data and the second data to output the second operation result. Here, first operation processing and second operation processing are two different operation manners.

The first data is also input into the target computing circuit 32 together with the first operation result and the second operation result. The target computing circuit 32 performs the first operation processing on the second operation result and the first operation result to output the first target result. The target computing circuit 32 also performs the second operation processing on the first data and the second operation result to output the second target result.

Herein, the first target result is configured to indicate a result of XOR operation of the first data and the second data, that is, the sum S obtained by the half addition operation, and the second target result is configured to indicate a result of AND operation of the first data and the second data, that is, the carry number C obtained by the half addition operation.

That is, through the in-memory computing circuit 30, after twice first operation processing and twice second operation processing, the first target result (sum S) and the second target result (carry number C) of the first data (summand A) and the second data (addend B) may be obtained, so that an operation result equivalent to that of the half adder may be obtained only by the in-memory computing circuit 30. In this way, the result of XOR operation and the result of AND operation of the first data and the second data are obtained through the storage and computing integrated manner, which improves the operation efficiency.

Figure 5:
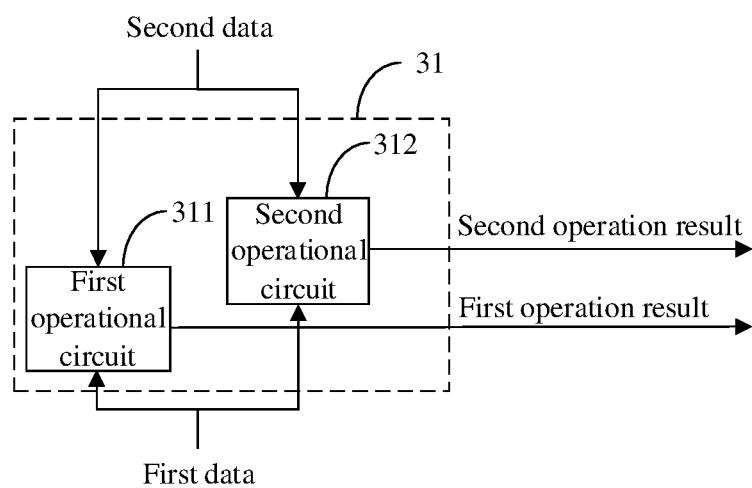
FIG. 5 is a schematic diagram of a composition structure of an initial computing circuit according to an embodiment of the present disclosure.

For the initial computing circuit 31, referring to FIG. 5, which shows a schematic diagram of a composition structure of an initial computing circuit 31 according to an embodiment of the present disclosure. As shown in FIG. 5, in some embodiments, the initial computing circuit 31 may include a first operational circuit 311 and a second operational circuit 312.

The first operational circuit 311 is configured to perform the first operation processing on the first data and the second data to output the first operation result.

The second operational circuit 312 is configured to perform the second operation processing on the first data and the second data to output the second operation result.

It is to be noted that, as shown in FIG. 5, the initial computing circuit 31 may include the first computing circuit 311 and the second computing circuit 312. The first computing circuit 311 is a circuit unit configured to perform first operation processing in the initial computing circuit 31, and the second operational circuit 312 is a circuit unit configured to perform second operation processing in the initial computing circuit 31.

The first data is input into the first operational circuit 311 and the second operational circuit 312 respectively, and the second data is also input into the first operational circuit 311 and the second operational circuit 312 respectively. The first operational circuit 311 performs first operation processing on the first data and the second data to obtain the first operation result. The second operational circuit 312 performs second operation processing on the first data and the second data to obtain the second operation result.

It is also to be noted that, for the first operational circuit 311, a truth table obtained by performing first operation processing is shown in Table 2.

TABLE 2

| First data (Summand A) | Second data (Addend B) | First operation result |
|---|---|---|
| 0 | 0 | 1 |
| 0 | 1 | 0 |
| 1 | 0 | 1 |
| 1 | 1 | 1 |

For the second operational circuit 312, a truth table obtained by performing second operation processing is shown in Table 3.

TABLE 3

| First data (Summand A) | Second data (Addend B) | Second operation result |
|---|---|---|
| 0 | 0 | 0 |
| 0 | 1 | 0 |
| 1 | 0 | 1 |
| 1 | 1 | 0 |

Figure 6:
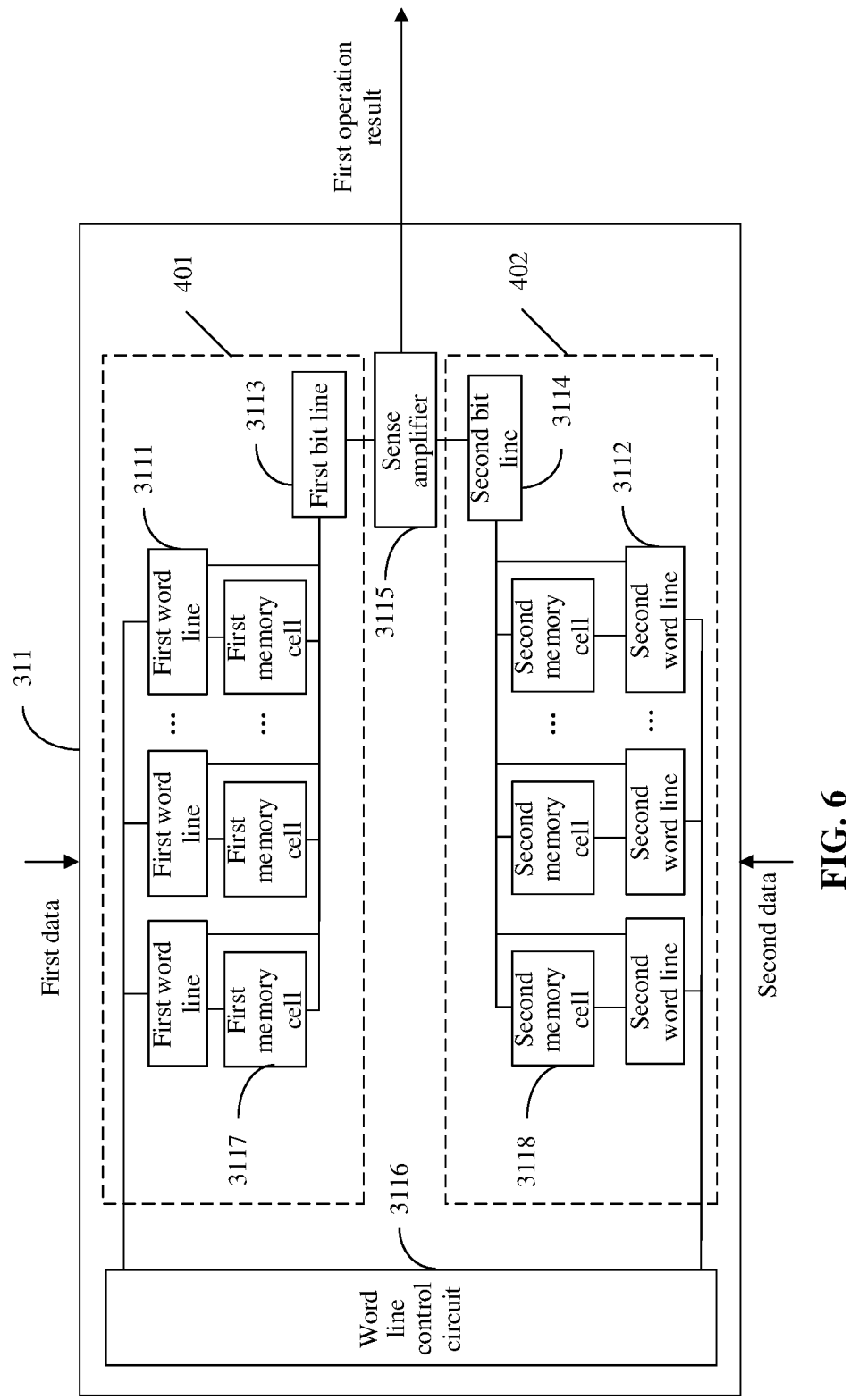
FIG. 6 is a schematic diagram of a composition structure of an operational circuit according to an embodiment of the present disclosure.

For the first operational circuit 311, referring to FIG. 6, which shows a schematic diagram of a composition structure of an operational circuit according to an embodiment of the present disclosure. Herein, FIG. 6 may be configured to represent a composition structure of the first operational circuit 311. As shown in FIG. 6, in some embodiments, the first operational circuit 311 may include a plurality of first word lines 3111, a plurality of second word lines 3112, a first bit line 3113, a second bit line 3114, a sense amplifier 3115, a word line control circuit 3116, a plurality of first memory cells 3117 and a plurality of second memory cells 3118.

The word line control circuit 3116 is configured to, after a target first word line is determined, change a level state of the target first word line, and control level states of remaining first word lines 3111 except the target first word line according to the first data to obtain the level states of the plurality of first word lines 3111.

The first bit line 3113 is configured to determine the level state of the first bit line 3113 according to the first data.

The plurality of first memory cells 3117 are configured to determine level states of the plurality of first memory cells 3117 according to the level states of the plurality of first word lines 3111 and the level state of the first bit line 3113.

The word line control circuit 3116 is further configured to control level states of the plurality of second word lines 3112 according to the second data to obtain the level states of the plurality of second word lines 3112.

The second bit line 3114 is configured to determine the level state of the second bit line 3114 according to the second data.

The plurality of second memory cells 3118 are configured to determine level states of the plurality of second memory cells 3118 according to the level states of the plurality of second word lines 3112 and the level state of the second bit line 3114.

The sense amplifier 3115 is configured to output the first operation result according to the level states of the plurality of first memory cells 3117 and the level states of the plurality of second memory cells 3118.

It is to be noted that the plurality of the first word lines 3111 and the second word lines 3112 are arranged, exemplarily, the numbers of the first word lines 3111 and the second word lines 3112 are both N, and N is a positive integer greater than or equal to 3. At the same time, the plurality of the first memory cells 3117 and the second memory cells 3118 are also arranged, exemplarily, the numbers of the first memory cells 3117 and the second memory cells 3118 are both M, and M is a positive integer greater than or equal to 3.

In addition, when the word line is in an activated (or called "on") state and an inactivated state, the level states are different, so that the memory cell connected therewith may be controlled to be turned on. Based on this, the level state of the word lines may be controlled, and then different memory cells may be turned on according to the level states of different word lines, thereby realizing the operation of the first data and the second data.

As shown in FIG. 6, for the convenience of distinguishing the first word line 3111 and the second word line 3112, and distinguishing the first memory cell 3117 and the second memory cell 3118 in the first operational circuit 311, a first area 401 and a second area 402 are divided in the first operational circuit 311. It is understandable that the division of the first area 401 and the second area 402 is only for the convenience of describing the embodiments of the present disclosure, but is not necessary, and does not constitute a limitation to the embodiment of the present disclosure.

As shown in FIG. 6, the word line control circuit 3116 is connected with the plurality of first word lines 3111 and the plurality of second word lines 3112 respectively. The word line control circuit 3116 may control the plurality of first word lines 3111 and the plurality of second word lines 3112 to be in an activated state or in the inactivated state.

It is also to be noted that, as shown in FIG. 6, the first operational circuit 311 further includes a first bit line 3113 and a second bit line 3114. The first bit line 3113 and the second bit line 3114 are both connected with the sense amplifier 3115.

That is, the first bit line 3113, the plurality of first word lines 3111, and the plurality of first memory cells 3117 are included in the first area 401. The second bit line 3114, the plurality of second words line 3112, and the plurality of second memory cells 3118 are included in the second area 402.

When first operation processing is performed on the first data and the second data, the first area 401 is configured to activate a certain number of first word lines 3111 according to the first data; and the second area 402 is configured to activate a certain number of second word lines 3112 according to the second data.

It is also to be noted that, when first operation processing is performed on the first data and the second data, it is first ensured that both the first area 401 and the second area 402 are in a zero clearing state, that is, the plurality of first word lines 3111 and the plurality of second word lines 3112 are all in the inactivated state. At this time, if both the first area 401 and the second area 402 are already in the zero clearing state, one target first word line is directly determined from the plurality of first word lines 3111, and the change of the level state of the target first word line is controlled. If the first area 401 and the second area 402 are not both in the zero clearing state, zero clearing processing needs to be performed first.

Therefore, in the first operational circuit 311, in some embodiments, the word line control circuit 3116 is further configured to perform zero clearing processing on the plurality of first word lines 3111, and perform zero clearing processing on the plurality of second word lines 3112.

After zero clearing processing is performed on the plurality of first word lines 3111 and the plurality of second word lines 3112, the plurality of first word lines 3111 and the plurality of second word lines 3112 are all in the inactivated state. In the embodiment of the present disclosure, the zero clearing state of the storage area may be that the word line in the storage area is in the inactivated state, and the inactivated state of the word line is a word line off state. By providing a low level signal for the word line, data "0" is written.

In some embodiments, a low level state may also be relative to a high level state capable of activating the word line, which is relatively high and low, and is not limited to a certain fixed level value.

It is also to be noted the target first word line may be any one of the plurality of first word lines 3111, and the word line control circuit 3116 may change the level state of the target first word line to activate the target first word line. For example, the level state of the target first word line is changed from the low level state to the high level state to activate the target first word line. In the embodiment of the present disclosure, the inactivated state (low level state) of the word line may be recorded as the first level state, and the activated state (high level state) of the word line may be recorded as the second level state, that is, the second level state may be a level state higher than the first level state, and the level state of the target first word line is changed to the high level state, that is data "1" is written into the target first word line.

Figure 7:
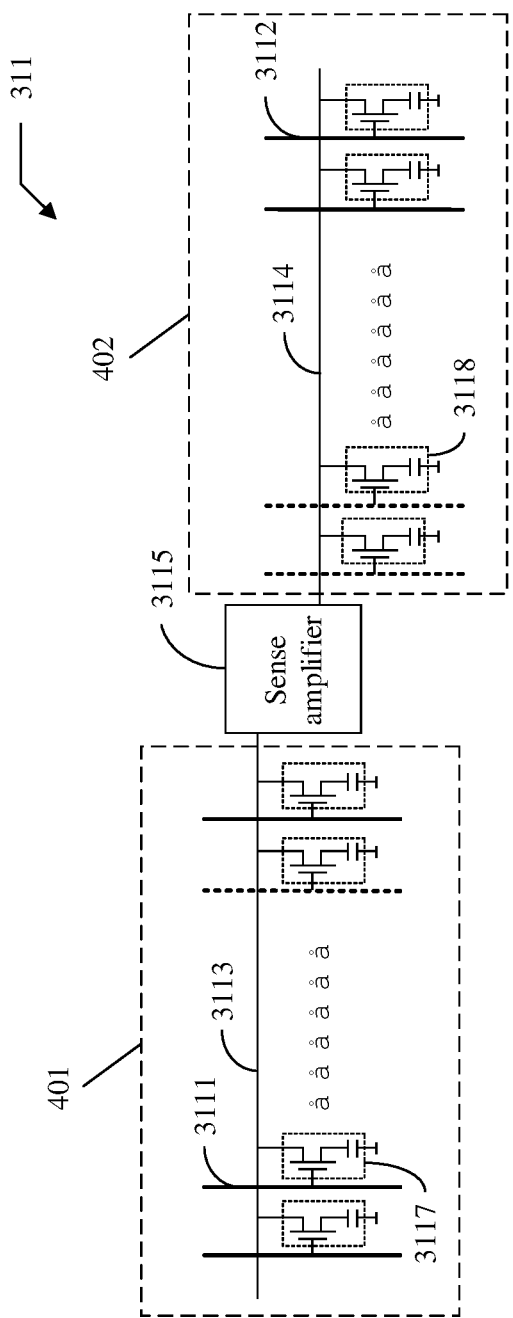
FIG. 7 is a first schematic diagram of a circuit structure of a first operational circuit according to an embodiment of the present disclosure.

Exemplarily, referring to FIG. 7, which shows a first schematic diagram of a circuit structure of a first operational circuit 311 according to an embodiment of the present disclosure. As shown in FIG. 7, in the first area 401, the first word line 3111 may be correspondingly connected with the plurality of first memory cells 3117, that is, the first word line 3111 may be correspondingly connected with the plurality of first memory cells 3117 (only one first memory cell 3117 connected with the first word line 3111 is shown in the figure). In the second area 402, the second word line 3112 may be correspondingly connected with the plurality of second memory cells 3118, that is, one second word line 3112 may be correspondingly connected with the plurality of second memory cells 3118 (only one second memory cell 3118 connected with the second word line 3112 is shown in the figure).

Each of the first memory cell 3117 and the second memory cell 3118 may be composed of a capacitor and a transistor. A gate of the transistor is connected with the word line, a source/drain is connected with the bit line, and a source/drain is connected with the capacitor.

Taking FIG. 7 as an example, the target first word line may be the last first word line 3111 in the first area 401, or may be any other first word line 3111 in the first area 401.

After the level state of the target first word line is changed to activate the target first word line, in the first operational circuit 311, a first word line in the activated state and a plurality of first word lines in the inactivated state are included in the first area 401, and the plurality of second word lines 3112 in the second area 402 are all in the inactivated state. That is, before the first data and the second data are not written, the number of the word lines in the activated state in the first area 401 is greater than that in the second area 402.

When the first data is written into the first area 401, level states of the remaining first word lines 3111 except the target first word line are controlled based on the first data to obtain the level states of the plurality of first word lines 3111. That is, the level states of the first word lines 3111 except the target first word line in the first area 401 are controlled based on the specific value of the first data, thereby writing the first data into the first area 401.

When the second data is written into the second area 402, the level states of the plurality of second word lines 3112 are controlled based on the second data to obtain the level states of the plurality of second word lines 3112. That is, the level states of the plurality of second word lines 3112 in the second area 402 are controlled based on the specific value of the second data, thereby writing the second data into the second area 402.

After the first data is written into the first area 401 and the second data is written into the second area 402, the number of the activated first word lines 3111 except the target first word line corresponds to the specific value of the first data, that is, the level states of the plurality of first word lines 3111 correspond to the specific value of the first data. The number of the activated second word lines 3112 corresponds to the specific value of the second data, that is, the level states of the plurality of second word lines 3112 correspond to the specific value of the second data. At this time, the level states of the plurality of first word lines 3111 and the plurality of second word lines 3112 may be obtained respectively.

The level states of the first bit line 3113 and the second bit line 3114 are related to the first data and the second data. When the first data is the first value "1", the first bit line 3113 is in the high level state. When the first data is the second value "0", the first bit line 3113 is in the low level state. When the second data is the first value "1", the second bit line 3114 is in the high level state. When the data is the second value "0", the second bit line 3114 is in the low level state.

For any memory cell, when the word line and bit line connected therewith are in the high level state, the high level of the word line may turn on the transistor in the memory cell, so that the high level of the bit line may be written into the capacitor of the memory cell, that is, data "1" is written into the capacitor.

In this way, each first memory cell 3117 may write data to its capacitor according to the level states of the first bit line 3113 and the first word line 3111 connected therewith to determine its own level state. Each second memory cell 3118 may write data to its capacitor according to the level states of the second bit line 3114 and the second word line 3112 connected therewith to determine its own level state. Therefore, the level states of the plurality of first memory cells 3117 and the plurality of second memory cells 3118 may be obtained.

The sense amplifier 3115 outputs the first operation result according to the level states of the plurality of first memory cells 3117 and the plurality of second memory cells 3118.

In this way, the embodiment of the present disclosure may complete operation processing of the data with the help of the word line to output the first operation result, and does not need to transfer the data from a storage module to a processor and then perform comparison operation using the processor, which improves the data processing speed and efficiency, and saves energy consumption.

Further, in some embodiments, the word line control circuit 3116 is configured to control the target first word line to be in an activated state after receiving a first activation instruction.

It is to be noted that, in the first operational circuit 311, the first activation instruction represents an instruction of activating the target first word line. After the word line control circuit 3116 receives the first activation instruction, it represents that the level state of the target first word line needs to be changed to activate the target first word line. At this time, the word line control circuit 3116 may adjust the target first word line from the low level state (first level state) to the high level state (second level state), thereby controlling the target first word line to be in the activated state.

It is also to be noted that, in the first operational circuit 311, when zero clearing processing is needed, a preset zero clearing instruction may be received through the word line control circuit 3116, and the preset zero clearing instruction represents an instruction of performing zero clearing processing on the specified storage area. After receiving the preset zero clearing instruction, the word line control circuit 3116 controls the plurality of first word lines 3111 and the plurality of second word lines 3112 to be in the inactivated state.

In the first operational circuit 311, for the writing manner of the first data, in some embodiments, the word line control circuit 3116 is further configured to, after receiving a second activation instruction, control at least two target first word lines 3111 except the target first word line to be in the activated state if the first data is a first value, and control the remaining first word lines 3111 except the target first word line to be in the inactivated state if the first data is a second value.

It is to be noted that, in the first operational circuit 311, the second activation instruction represents an instruction of writing the first data. When the word line control circuit 3116 receives the second activation instruction, it indicates that the first data needs to be written. Since the first data is a one-bit binary number, it may be classified into two cases: a case where the value of the first data is the first value "1", or a case where the first data is the second value "0".

If the first data is the first value, the at least two first word lines 3111 except the target first word line are determined from the plurality of first word lines 3111, and the at least two first word lines 3111 are controlled to be in the activated state, that is, the level states of the at least two first word lines 3111 are changed from the low level state to the high level state, so that there are at least three first word lines 3111 in the activated state in the first area 401.

If the first data is the second value, since the first word lines 3111 except the target first word line are already in the inactivated state, there is no need to process the plurality of first word lines 3111 to control the remaining first word lines 3111 except the target first word line to be in the inactivated state, that is, the remaining first word lines 3111 except the target first word line are all maintained in the inactivated state, so that there are at least one first word line 3111 in the activated state in the first area 401.

Figure 8:
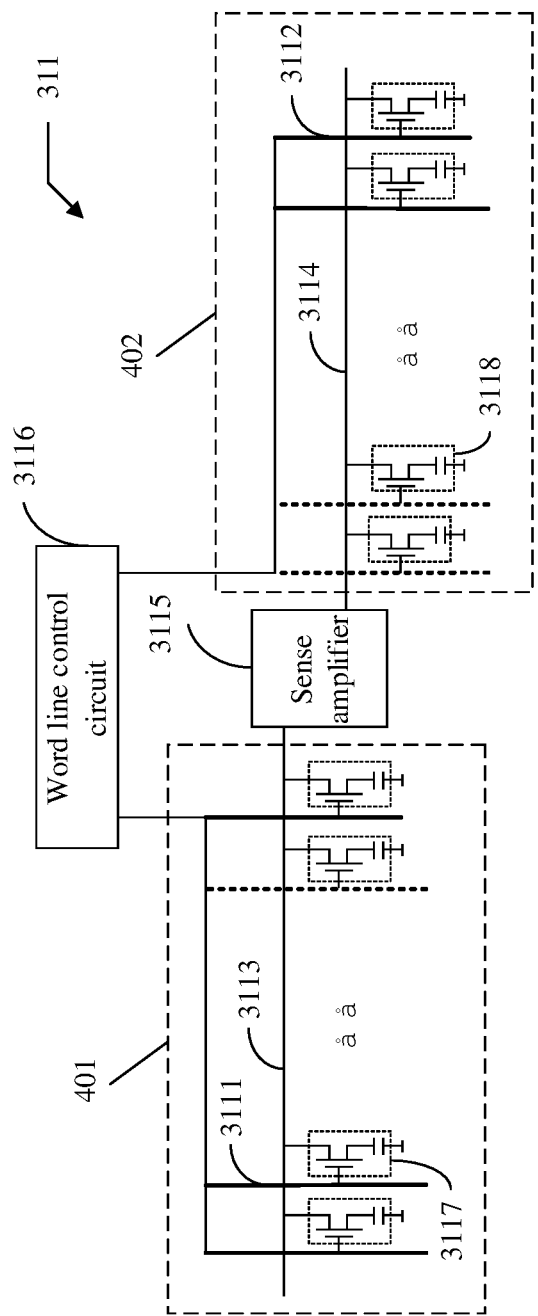
FIG. 8 is a second schematic diagram of a circuit structure of a first operational circuit according to an embodiment of the present disclosure.

Exemplarily, referring to FIG. 8, which shows a second schematic diagram of a circuit structure of a first operational circuit 311 according to an embodiment of the present disclosure. As shown in FIG. 8 (or FIG. 7), in the first area 401, the vertical solid line represents the first word line 3111 in the activated state, and the vertical dotted line represents the first word line 3111 in the inactivated state. In the first area 401 of FIG. 8, the first and second first word lines 3111 and the last first word line 3111 (that is, the target first word line) are in the activated state, and the remaining first word lines 3111 are in the inactivated state.

In this way, by controlling the level states of the first word lines 3111, a certain number of the first word lines 3111 are in the activated state, and the first data may be written into the first area 401 in the first operational circuit 311, so that there is no need to transmit data between the processor and the storage module, and the data processing speed is improved.

In the first operational circuit 311, for the writing manner of the second data, in some embodiments, when the second data is written into the second area 402, the word line control circuit 3116 is further configured to, after receiving a third activation instruction, control at least two target second word lines 3112 in the second area 402 to be in the activated state if the second data is a first value, and control the plurality of second word lines 3112 to be in the inactivated state if the second data is a second value.

It is to be noted that, in the first operational circuit 311, the third activation instruction represents an instruction of writing the second data. When the word line control circuit 3116 receives the third activation instruction, it indicates that the second data needs to be written. Similar to the first data, since the second data is also a one-bit binary number, it may also be classified into two cases: a case where the value of the second data is the first value "1", and a case where the second data is the second value "0".

If the second data is the first value, at least two second word lines 3112 are determined from the plurality of second word lines 3112, and the at least two second word lines 3112 are controlled to be in the activated state.

It is also to be noted that, in the embodiment of the present disclosure, for the first word line 3111 and the second word line 3112, when the level state is changed, if the low level state of the first word line 3111 and the low level state of the second word line 3112 are the same level state, and the high level state of the first word line 3111 and the high level state of the second word line 3112 are the same level state (the same level here allows a deviation within the error range), then in a case where the first data and the second data are both the first value, the number of the at least two activated first word lines 3111 is identical to the number of the at least two activated second word lines 3112. That is, if in a case where the first data is the first value, the number of the activated first word lines 3111 is two, then in a case where the second data is the second value, the number of the activated second word lines 3112 is also two. If in a case where the first data is the first value, the number of the activated first word lines 3111 is three, then in a case where the second data is the second value, the number of the activated second word line 3112 is three.

If the second data is the second value, since the plurality of second word lines 3112 are already in the inactivated state, there is no need to process the plurality of second word lines 3112. At this time, all the second word lines 3112 are in the inactivated state.

That is, except the target first word line, when the data is the first value "1", at least two word lines need to be activated in the corresponding area, and when the data is the second value "0", there is no need to activate the word line in the corresponding area.

Exemplarily, as shown in FIG. 8 (or FIG. 7), in the second area 402, the vertical solid line represents the second word line 3112 in the activated state, and the vertical dotted line represents the second word line 3112 in the inactivated state. In the second area 402 of FIG. 8, the last and the penultimate second word lines 3112 are in the activated state, and the remaining second word lines 3112 are in the inactivated state.

That is, FIG. 8 shows a schematic diagram of the state of the first operational circuit 311 in a case where the first data and the second data are both the first value.

When the first data and the second data are written, the word line may be selectively activated according to the levels of the first bit line 3113 and the second bit line 3114. For example, for the first area 401, if the first data is the first value "1", the first bit line 3113 is in the high level state, it indicates that at least two first word lines 3111 except the target first word line in the first area 401 need to be activated. If the first data is the second value "0", the first bit line 3113 is in the low level state, at this time, there is no need to activate the first word line 3111 except the target first word line in the first area 401. For the second area 402, if the second data is the first value "1", the second bit line 3114 is in the high level state, it indicates that at least two second word lines 3112 in the second area 402 need to be activated. If the second data is the second value "0", the second bit line 3114 is in the low level state, at this time, there is no need to activate the second word line 3112 in the second area 402.

In this way, by controlling the level states of the word lines, a certain number of the second word lines 3112 are in the activated state, and the second data may be written into the second area 402 in the first operational circuit 311, so that there is no need to transmit data between the processor and the storage module, and the data processing speed is improved.

Further, in some embodiments, the sense amplifier 3115 is configured to perform comparison operation on the first data and the second data and output the first operation result after receiving a preset comparison instruction.

In the first operational circuit 311, the preset comparison instruction represents an instruction of performing comparison operation on the first data and the second data, and outputting the first operation result. After receiving the preset comparison instruction, the sense amplifier 3115 may read first voltage provided by the plurality of first memory cells 3117 and second voltage provided by the plurality of second memory cells 3118, and perform comparison operation on the first data and the second data according to the first voltage and the second voltage to obtain the first operation result for output. Herein, if the first voltage is higher than the second voltage, the first operation result output by the sense amplifier 3115 is a first result value; or, if the first voltage is lower than the second voltage, the first operation result output by the sense amplifier 3115 is a second result value.

Specifically, when the first data and the second data are written, the first word line 3111 and the second word line 3112 are selectively activated when the first bit line 3113 and the second bit line 3114 are at a high potential (high level state), the activated first word line 3111 and the second word line 3112 are in an on state, at this time, the first bit line 3113 and the second bit line 3114 may respectively write data into the capacitors connected with the memory cells thereof, that is, when the first bit line 3113 and the second bit line 3114 are both at the high potential, data "1" may be written into a first capacitor of the first memory cell 3117 connected with the first bit line 3113 and the first word line 3111 in the on state at the same time, and data "1" may also be written into a second capacitor of a second memory cell 3118 connected with the second bit line 3114 and the second word line 3112 in the on state at the same time. When the plurality of first word lines 3111 and second word lines 3112 are activated, it represents that data is written into the plurality of first capacitors and corresponding second capacitors, and the first capacitors and the second capacitors are located in the first area 401 and the second area 402 respectively. After receiving the preset comparison instruction, the sense amplifier 3115 reads the data in the first capacitor and the second capacitor respectively, and compares the first voltage read from the first capacitor with the second voltage read from the second capacitor. If the first voltage is higher than the second voltage, it indicates that the overall level state of the first area 401 is higher than the overall level state of the second area 402, that is, the number of the first capacitors into which data is written is greater than the number of the second capacitors, in other words, the number of the first word lines 3111 in the activated state is greater than the number of the second word lines 3112 in the activated state, then the first result value is output as the first operation result, and the first result value may be the same as the first value and may be "1".

If the first voltage is lower than the second voltage, it indicates that the overall level state of the first area 401 is lower than the overall level state of the second area 402, that is, the number of the first capacitors into which data is written is smaller than the number of the second capacitors, that is, the number of the first word lines 3111 in the activated state is smaller than the number of the second word lines 3112 in the activated state, then the second result value is output as the first operation result, and the second result value may be the same as the second value and may be "0".

In some embodiments, for the first operational circuit 311, if the first data and the second data are both the second value "0", then the target first word line is in the activated state in the first area 401. All the second word lines 3112 are in the inactivated state in the second area 402. That is, the number of the first word lines 3111 in the activated state in the first area 401 is greater than the number of the second word lines 3112 in the activated state in the second area 402, so that the number of the first capacitors into which data is written is greater than the number of the second capacitors into which data is written, and the sense amplifier 3115 outputs the first result value "1".

If the first data is the second value "0" and the second data is the first value "1", then only the target first word line is in the activated state in the first area 401. At least two second word lines 3112 are in the activated state in the second area 402, that is, the number of the first word lines 3111 in the activated state in the first area 401 is smaller than the number of the second word lines 3112 in the activated state in the second area 402, so that the number of the first capacitors into which data is written is smaller than the number of the second capacitors into which data is written, and the sense amplifier 3115 outputs the second result value "0".

If the first data is the first value "1" and the second data is the second value "0", then at least three first word lines 3111 (including the target first word line) are in the activated state in the first area 401. All the second word lines 3112 are in the inactivated state in the second area 402, that is, the number of the first word lines 3111 in the activated state in the first area 401 is greater than the number of the second word lines 3112 in the activated state in the second area 402, so that the number of the first capacitors into which data is written is greater than the number of the second capacitors into which data is written, and the sense amplifier 3115 outputs the first result value "1".

If the first data and the second are both the first value "1", then at least three first word lines 3111 (including the target first word line) are in the activated state in the first area 401. At least two second word lines 3112 are in the activated state in the second area 402. Except the target first word line, in the first area 401 and the second area 402, the number of the first word lines 3111 in the activated state is identical to the number of the second word lines 3112 in the activated state, and then the first area 401 has one more target first word line in the activated state than the second area 402, so that the number of the first capacitors into which data is written is greater than the number of the second capacitors into which data is written, and the sense amplifier 3115 outputs the first result value "1".

Based on the first operational circuit 311 provided by the embodiment of the present disclosure, in a case of four different value combinations of the first data and the second data, a truth table as shown in Table 3 may be obtained. The first operational circuit 311 in the storage area completes operation processing on the data, so that there is no need to transfer the data from the storage module to the processor for operation, which effectively improves the operation processing speed and saves energy consumption.

For the second operational circuit 312, referring to FIG. 6. which may also be configured to represent a composition structure of the second operational circuit 312, that is, the first operational circuit 311 and the second operational circuit 312 may have the same composition structure. At this time, only the output of the sense amplifier 3115 is set as the second operation result. As shown in FIG. 6, in some embodiments, the second operational circuit 312 may include a plurality of first word lines 3111, a plurality of second word lines 3112, a first bit line 3113, a second bit line 3114, a sense amplifier 3115, a word line control circuit 3116, a plurality of first memory cells 3117 and a plurality of second memory cells 3118.

The word line control circuit 3116 is configured to control level states of the plurality of first word lines 3111 according to first data to obtain the level states of the plurality of first word lines 3111.

The first bit line 3113 is configured to determine the level state of the first bit line 3113 according to the first data.

The plurality of first memory cells 3117 are configured to determine level states of the plurality of first memory cells 3117 according to the level states of the plurality of first word lines 3111 and the level state of the first bit line 3113.

The word line control circuit 3116 is further configured to, after a target second word line is determined, change a level state of the target second word line, and control level states of remaining second word lines 3112 except the target second word line according to the second data to obtain the level states of the plurality of second word lines 3112.

The second bit line 3114 is configured to determine the level state of the second bit line 3114 according to the second data.

The plurality of second memory cells 3118 are configured to determine level states of the plurality of second memory cells 3118 according to the level states of the plurality of second word lines 3112 and the level state of the second bit line 3114.

The sense amplifier 3115 is configured to output the second operation result according to the level states of the plurality of first memory cells 3117 and the level states of the plurality of second memory cells 3118.

It is to be noted that, as shown in FIG. 6, the composition structures of the second operational circuit 312 and the first operational circuit 311 may be the same, but the working manners of the two are different. In the second operational circuit 312, the connection manners between the devices are the same as those of the first operational circuit 311, which may not be repeatedly described here.

It is also to be noted that, similar to the first operational circuit 311, when performing second operation processing on the first data and the second data, it is ensured that both the first area 401 and the second area 402 are in the zero clearing state first. At this time, if both the first area 401 and the second area 402 are already in the zero clearing state, one target second word line is directly determined from the plurality of second word lines 3112, and the change of the level state of the target second word line is controlled. If the first area 401 and the second area 402 are not both in the zero clearing state, zero clearing processing needs to be performed first.

Therefore, in the second operational circuit 312, in some embodiments, the word line control circuit 3116 is further configured to perform zero clearing processing on the plurality of first word lines 3111, and perform zero clearing processing on the plurality of second word lines 3112.

After zero clearing processing is performed on the plurality of first word lines 3111 and the plurality of second word lines 3112, the plurality of first word lines 3111 and the plurality of second word lines 3112 are all in the inactivated state.

It is also to be noted that, the target second word line may be any one of the plurality of second word lines 3112, and the word line control circuit 3116 may change the level state of the target second word line to activate the target second word line.

Figure 9:
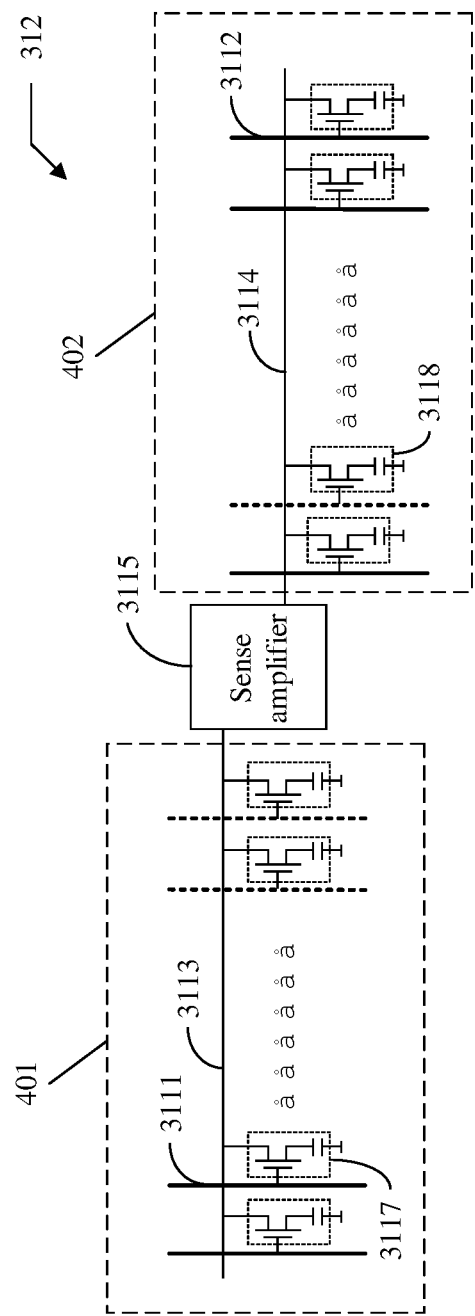
FIG. 9 is a first schematic diagram of a circuit structure of a second operational circuit according to an embodiment of the present disclosure.

Exemplarily, referring to FIG. 9, which shows a schematic diagram 1 of a circuit structure of a second operational circuit 312 according to an embodiment of the present disclosure. As shown in FIG. 9, the circuit structures of the second operational circuit 312 and the first operational circuit 311 may be the same, but the working manners are different. Referring also to FIG. 6, FIG. 6 may also be configured to represent the composition structure of the second operational circuit 312.

Taking FIG. 9 as an example, the target second word line may be the first second word line 3112 in the second area 402, or may be any other second word line 3112 in the second area 402.

After the level state of the target second word line is changed to activate the target second word line, in the second operational circuit 312, the plurality of first word lines 3111 in the first area 401 are all in the inactivated state, and one target second word line in the activated state and the plurality of second word lines 3112 in the inactivated state are included in the second area 402. That is, before the first data and the second data are not written, the number of the word lines in the activated state in the first area 401 is greater than that in the second area 402, and the overall level state of the first area is lower than that of the second area 402.

When the first data is written into the first area 401, the level states of the plurality of first word lines 3111 are controlled based on the first data, thereby obtaining the level states of the plurality of first word lines 3111. That is, the level states of the plurality of first word lines 3111 in the first area 401 are controlled based on the specific value of the first data, thereby writing the first data into the first area 401.

When the second data is written into the second area 402, the level states of the remaining second word lines 3112 except the target second word line in the plurality of second word lines 3112 are controlled based on the second data, thereby obtaining the level states of the plurality of second word lines 3112. That is, the level states of the second word lines 3112 except the target second word line in the second area 402 are controlled based on the specific value of the second data, thereby writing the second data into the second area 402.

After the first data is written into the first area 401 and the second data is written into the second area 402, the number of the activated first word lines 3111 corresponds to the specific value of the first data, that is, the level states of the plurality of first word lines 3111 corresponds to the specific value of the first data. The number of the activated second word lines 3112 except the target second word line corresponds to the specific value of the second data, that is, the level states of the plurality of second word lines 3112 corresponds to the specific value of the second data. At this time, the level states of the plurality of first word lines 3111 and the plurality of second word lines 3112 may be obtained respectively.

Similar to the first operational circuit 311, in the second operational circuit 312, the level states of the plurality of first memory cells 3117 and the plurality of second memory cells 3118 may be obtained based on the first data, the second data, and the level states of the first bit line 3113, the second bit line 3114, the plurality of first word lines 3111 and the plurality of second word lines 3112.

The sense amplifier 3115 outputs the second operation result according to the level states of the plurality of first memory cells 3117 and the plurality of second memory cells 3118.

The embodiment of the present disclosure may complete operation processing of the data with the help of the device structure of the storage area to output the second operation result, and does not need to transfer the data from the storage module to the processor and then perform comparison operation using the processor, which improves the data processing speed and efficiency, and saves energy consumption.

Further, in some embodiments, the word line control circuit 3116 is configured to control the target second word line to be in the activated state after receiving a first activation instruction.

It is to be noted that, in the second operational circuit 312, the first activation instruction represents an instruction of activating the target second word line. After the word line control circuit 3116 receives the first activation instruction, the target second word line is controlled to be in the activated state.

It is also to be noted that, in the second operational circuit 312, when zero clearing processing is needed, the implementation process may refer to the manner of performing zero clearing processing in the first operational circuit 311, which may not be repeatedly described here.

In the second operational circuit 312, for the writing manner of the first data, in some embodiments, the word line control circuit 3116 is further configured to, after receiving a second activation instruction, control at least two first word lines 3111 to be in the activated state if the first data is the first value, and control the plurality of first word lines 3111 to be in the inactivated state if the first data is the second value.

It is to be noted that, in the second operational circuit 311, the second activation instruction represents an instruction of writing the first data. When the word line control circuit 3116 receives the second activation instruction, it indicates that the first data needs to be written. At this time, it may still be classified into two cases: a case where the value of the first data is the first value "1", or a case where the first data is the second value "0".

If the first data is the first value, the at least two first word lines 3111 are determined from the plurality of first word lines 3111, and the at least two first word lines 3111 are controlled to be in the activated state, so that at least two first word lines 3111 are in the activated state in the first area 401.

If the first data is the second value, since the plurality of first word lines 3111 are already in the inactivated state, there is no need to process the plurality of first word lines 3111 to control all the first word lines 3111 to be in the inactivated state.

Figure 10:
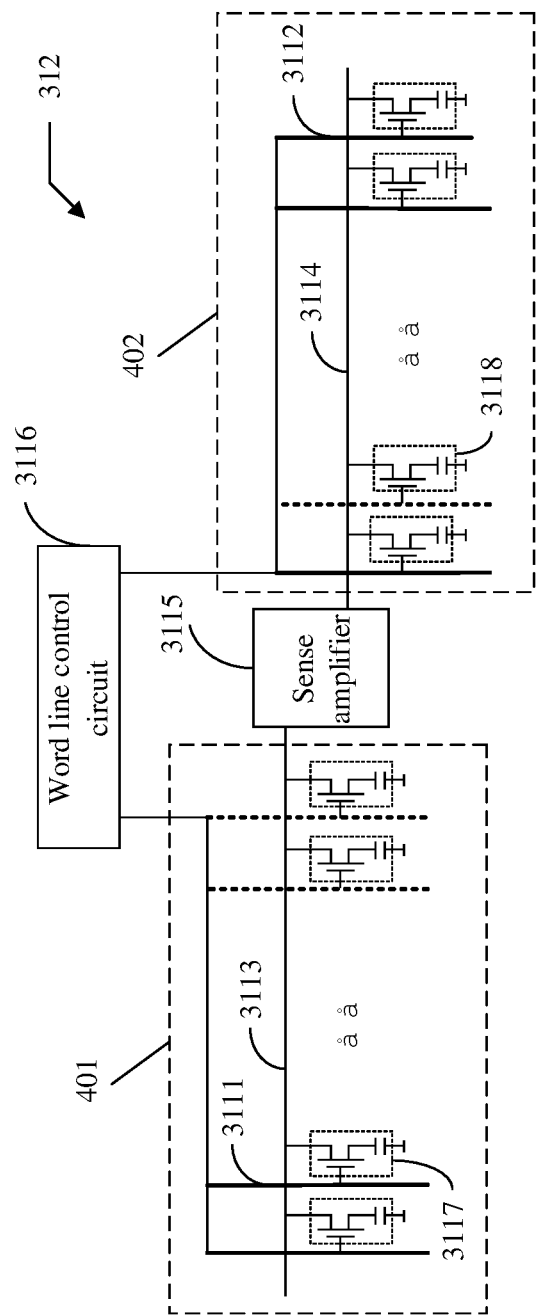
FIG. 10 is a second schematic diagram of a circuit structure of a second operational circuit according to an embodiment of the present disclosure.

Exemplarily, referring to FIG. 10, which shows a second schematic diagram of a circuit structure of a second operational circuit 312 according to an embodiment of the present disclosure. as shown in FIG. 10 (or FIG. 9), in the first area 401, the vertical solid line represents the first word line 3111 in the activated state, and the vertical dotted line represents the first word line 3111 in the inactivated state. In the first area 401 of FIG. 11, the first and second first word lines 3111 are in the activated state, and the remaining first word lines 3111 are in the inactivated state.

In the second operational circuit 312, for the writing manner of the second data, in some embodiments, when the second data is written into the second area 402, the word line control circuit 3116 is further configured to, after receiving a third activation instruction, control at least two second word lines 3112 except the target second word line in the second area 402 to be in the activated state if the second data is a first value, and control the remaining second word lines 3112 except the target second word line to be in the inactivated state if the second data is a second value.

It is to be noted that, in the second operational circuit 312, the third activation instruction represents an instruction of writing the second data. When the word line control circuit 3116 receives the third activation instruction, it indicates that the second data needs to be written. At this time, it may still be classified into two cases: a case where the value of the second data is the first value "1", and a case where the second data is the second value "0".

If the second data is the first value, the at least two second word lines 3112 except the target second word line are determined from the plurality of second word lines 3112, and the at least two second word lines 3112 are controlled to be in the activated state.

If the second data is the second value, since the second word lines 3112 except the target second word line are already in the inactivated state, that is, the low level state, there is no need to process the plurality of second word lines 3112. At this time, the remaining second word lines 3112 except the target second word line are controlled to be in the inactivated state.

That is, except the target second word line, when the data is the first value "1", at least two word lines need to be activated in the corresponding area, and when the data is the second value "0", there is no need to activate the word line in the corresponding area.

Exemplarily, as shown in FIG. 10 (or FIG. 9), in the second area 402, the vertical solid line represents the second word line 3112 in the activated state, and the vertical dotted line represents the second word line 3112 in the inactivated state. In the second area 402 of FIG. 11, the last and the penultimate second word lines 3112 and the first second word line 3112 (that is, target second word line) are in the activated state, and the remaining second word lines 3112 are in the inactivated state.

That is, FIG. 10 shows a schematic diagram of the state of the second operational circuit 312 in a case where the first data and the second data are both the first value.

When the first data and the second data are written, the word line may be selectively activated according to the levels of the first bit line 3113 and the second bit line 3114. For example, for the first area 401, if the first data is the first value "1", the first bit line 3113 is in the high level state, it indicates that at least two first word lines 3111 in the first area 401 need to be activated. If the first data is the second value "0", the first bit line 3113 is in the low level state, at this time, there is no need to activate the first word line 3111 in the first area 401. For the second area 402, if the second data is the first value "1", the second bit line 3114 is in the high level state, it indicates that at least two second word lines 3112 except the target second word line in the second area 402 need to be activated. If the second data is the second value "0", the second bit line 3114 is in the low level state, at this time, there is no need to activate the second word line 3112 except the target second word line in the second area 402.

Further, for the second operation result, in some embodiments, the sense amplifier 3115 is configured to perform comparison operation on the first data and the second data and output the second operation result after receiving the preset comparison instruction.

In the second operational circuit 312, the preset comparison instruction represents an instruction of performing comparison operation on the first data and the second data, and outputting the second operation result. After receiving the preset comparison instruction, the sense amplifier 3115 may read first voltage provided by the plurality of first memory cells 3117 and second voltage provided by the plurality of second memory cells 3118, and perform comparison operation on the first data and the second data according to the first voltage and the second voltage to obtain the second operation result for output.

If the first voltage is higher than the second voltage, the second operation result output by the sense amplifier 3115 is a first result value; or, if the first voltage is lower than the second voltage, the second operation result output by the sense amplifier 3115 is a second result value.

Here, the specific manner of data writing is the same as that of the above first operational circuit 311, which may not be repeatedly described here.

If the first voltage is higher than the second voltage, the first result value is output as the second operation result, and the first result value may be the same as the first value and may be "1".

If the first voltage is lower than the second voltage, the second result value is output as the second operation result, and the second result value may be the same as the second value and may be "0".

In this way, for the second operational circuit 312, if the first data and the second data are both the second value "0", then all the first word lines 3111 are in the inactivated state in the first area 401. The target second word line is in the activated state in the second area 402. That is, the number of the first word lines 3111 in the activated state in the first area 401 is smaller than the number of the second word lines 3111 in the activated state in the second area 402, so that the number of the first capacitors into which data is written is smaller than the number of the second capacitors into which data is written, and the sense amplifier 3115 outputs the second result value "0".

If the first data is the second value "0" and the second data is the first value "1", then all the first word lines 3111 are in the inactivated state in the first area 401. At least three second word lines 3112 (including the target second word line) are in the activated state in the second area 402. That is, the number of the first word lines 3111 in the activated state in the first area 401 is smaller than the number of the second word lines 3112 in the activated state in the second area 402, so that the number of the first capacitors into which data is written is smaller than the number of the second capacitors into which data is written, and the sense amplifier 3115 outputs the second result value "0".

If the first data is the first value "1" and the second data is the second value "0", then at least two first word lines 3111 are in the activated state in the first area 401. Only the target second word line is in the activated state in the second area 402. That is, the number of the first word lines 3111 in the activated state in the first area 401 is greater than the number of the second word lines 3112 in the activated state in the second area 402, so that the number of the first capacitors into which data is written is greater than the number of the second capacitors into which data is written, and the sense amplifier 3115 outputs the first result value "1".

If the first data and the second are both the first value "1", then at least two first word lines 3111 are in the activated state in the first area 401. At least three second word lines 3112 (including the target second word line) are in the activated state in the second area 402. Except the target second word line, in the first area 401 and the second area 402, the number of the first word lines 3111 in the activated state is identical to the number of the second word lines 3112 in the activated state, and then the second area 402 has one more target second word line in the activated state than the first area 401, so that the number of the first capacitors into which data is written is smaller than the number of the second capacitors into which data is written, and the sense amplifier 3115 outputs the first result value "0".

Based on the second operational circuit 312 provided by the embodiment of the present disclosure, in a case of four different value combinations of the first data and the second data, a truth table as shown in Table 3 may be obtained. Through the second operational circuit 312, there is no need to transfer data from the storage module to the processor for operation, which effectively improves the operation processing speed and saves energy consumption.

Figure 11:
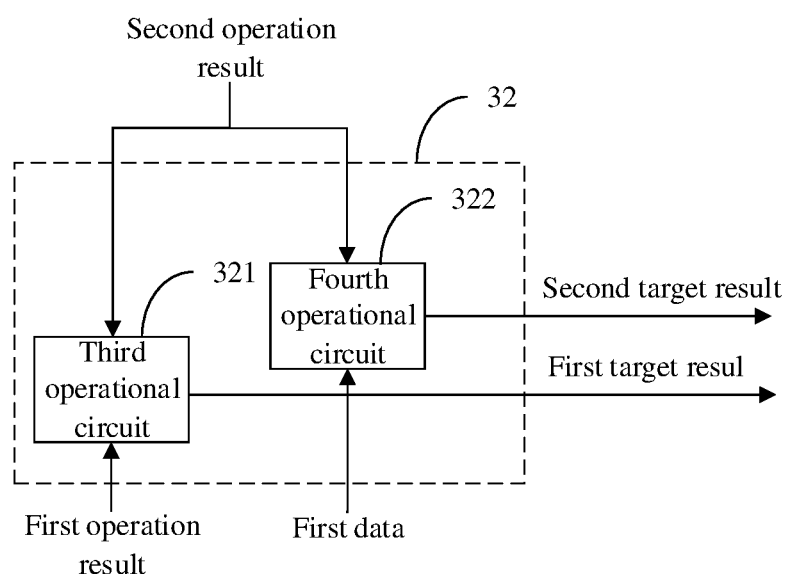
FIG. 11 is a schematic diagram of a composition structure of a target computing circuit according to an embodiment of the present disclosure.

For the target computing circuit 32, referring to FIG. 11, which shows a schematic diagram of a composition structure of a target computing circuit 32 according to an embodiment of the present disclosure. As shown in FIG. 11, in some embodiments, the target computing circuit 32 may include a third operational circuit 321 and a fourth operational circuit 322.

The third operational circuit 321 is configured to perform the first operation processing on the second operation result and the first operation result to output the first target result.

The fourth operational circuit 322 is configured to perform the second operation processing on the first data and the second operation result to output the second target result.

It is to be noted that, as shown in FIG. 11, the target computing circuit 32 may include the third operational circuit 321 and the fourth operational circuit 322. The third operational circuit 321 is a circuit unit configured to perform first operation processing in the target computing circuit 32, and the third operational circuit 322 is a circuit unit configured to perform second operation processing in the target computing circuit 32.

For the third operational circuit 321, the input is the first operation result output by the first operational circuit 311 and the second operation result output by the second operational circuit 312, and the first operation processing is performed on the first operation result and the second operation result to output the first target result.

For the fourth operational circuit 322, the input is the first data and the second operation result output by the second operation result output by the second operational circuit 312, and the second operation processing is performed on the first data and the second operation result to output the second target result.

It is also to be noted that, for the third operational circuit 321, a truth table obtained by performing first operation processing is shown in Table 4.

TABLE 4

| First data (Summand) | Second data (Addend) | Second operation Result | First operation Result | First target Result |
|---|---|---|---|---|
| 0 | 0 | 0 | 1 | 0 |
| 0 | 1 | 0 | 0 | 1 |
| 1 | 0 | 1 | 1 | 1 |
| 1 | 1 | 0 | 1 | 0 |

It is to be noted that the operation manners of the third operational circuit 321 and the first operational circuit 311 are both first operation processing, that is, the operation manners of the two circuits are identical to each other. Therefore, the truth tables of the third operational circuit and first operation processing are the same except that the inputs of the third operational circuit 321 depend on the outputs of the first operational circuit 311 and the second operational circuit 312.

That is, the inputs of the third operational circuit 321 are operation results obtained by processing the first data and the second data by the first operational circuit 311 and the second operational circuit 312. For the first data and the second data, there are four different combinations as shown in the first and second columns of Table 4. Under different combinations, the obtained first and second operation results are shown in the fourth and third columns of Table 4. After the third operational circuit 321 performs first operation processing on the first operation result and the second operation result, the output first target result is shown in the fifth column of Table 5, and the first target result is a result of XOR operation of the first data and the second data, that is, the sum S.

For the fourth operational circuit 322, a truth table obtained by performing second operation processing is shown in Table 5.

TABLE 5

| First data (Summand) | Second data (Addend) | First data (Summand) | Second operation Result | Second target Result |
|---|---|---|---|---|
| 0 | 0 | 0 | 0 | 0 |
| 0 | 1 | 0 | 0 | 0 |
| 1 | 0 | 1 | 1 | 0 |
| 1 | 1 | 1 | 0 | 1 |

It is to be noted that the operation manners of the fourth operational circuit 322 and the second operational circuit 312 are both second operation processing, that is, the operation manners of the two circuits are identical to each other except that the input of the fourth operational circuit 322 depends on the output of the second operational circuit 312.

The inputs of the fourth operational circuit 322 are the first data, and the second operation result obtained by performing the second operation processing on the first data and the second data by the second operational circuit 312. For the first data and the second data, there are four different combinations as shown in the first and second columns of Table 5. Under different combinations, the obtained second operation result is shown in the fourth column of Table 5. After the fourth operational circuit 322 performs the second operation processing on the first data and the second operation result, the output second target result is shown in the fifth column of Table 5, and the second target result is a result of AND operation of the first data and the second data, that is, the carry number C. In this way, the in-memory computing circuit 30 is formed based on the first operational circuit 311, the second operational circuit 312, the third operational circuit 321 and the fourth operational circuit 322. For the in-memory computing circuit 30, its truth table is Table 1, that is, the function of the half adder may be realized in the memory based on the in-memory computing circuit 30 without data transfer.

It is to be noted that, in the embodiment of the present disclosure, the first operational circuit 311, the second operational circuit 312, the third operational circuit 321 and the fourth operational circuit 322 may have the same composition structure, which may refer to the schematic diagram of the composition structure as shown in FIG. 6. For the third operational circuit 321, the input of the first area 401 is the second operation result, the input of the second area 402 is the first operation result, and the output of the sense amplifier 3115 is the first target result. For the fourth operational circuit 322, the input of the first area 401 is the first data, the input of the second area 402 is the second operation result, and the output of the sense amplifier 3115 is the second target result.

Therefore, for the third operational circuit 321:

in some embodiments, the third operational circuit may include a plurality of first word lines, a plurality of second word lines, a first bit line, a second bit line, a sense amplifier, a word line control circuit, a plurality of first memory cells, and a plurality of second memory cells.

The word line control circuit is configured to, after a target first word line is determined, change a level state of the target first word line, and control level states of remaining first word lines except the target first word line according to the second operation result to obtain the level states of the plurality of first word lines.

The first bit line is configured to determine the level state of the first bit line according to the second operation result.

The plurality of first memory cells are configured to determine level states of the plurality of first memory cells according to the level states of the plurality of first word lines and the level state of the first bit line.

The word line control circuit is further configured to control level states of the plurality of second word lines according to the first operation result to obtain the level states of the plurality of second word lines.

The second bit line is configured to determine the level state of the second bit line according to the first operation result.

The plurality of second memory cells are configured to determine level states of the plurality of second memory cells according to the level states of the plurality of second word lines and the level state of the second bit line.

The sense amplifier is configured to output the first operation result according to the level states of the plurality of first memory cells and the level states of the plurality of second memory cells.

In some embodiments, the word line control circuit is further configured to perform zero clearing processing on the plurality of first word lines, and perform zero clearing processing on the plurality of second word lines.

In some embodiments, the word line control circuit is configured to control the target first word line to be in an activated state after receiving a first activation instruction.

In some embodiments, the word line control circuit is further configured to, after receiving a second activation instruction, control at least two first word lines except the target first word line to be in the activated state if the second operation result is a first result value, and control the remaining first word lines except the target first word line to be in the inactivated state if the first operation result is a second result value.

In some embodiments, the word line control circuit is further configured to, after receiving a third activation instruction, control at least two second word lines to be in the activated state if the first operation result is the first result value, and control the plurality of second word lines to be in the inactivated state if the first operation result is the second result value.

In some embodiments, the sense amplifier is configured to, after receiving a preset comparison instruction, read first voltage provided by the plurality of first memory cells and second voltage provided by the plurality of second memory cells, and perform comparison operation on the second operation result and the first operation result according to the first voltage and the second voltage to output the first operation result.

If the first voltage is higher than the second voltage, the first operation result output by the sense amplifier is the first result value; or, if the first voltage is lower than the second voltage, the first operation result output by the sense amplifier is the second result value.

It is to be noted that an operation manner of the third operational circuit is identical to an operation manner of the first operational circuit, and the specific description of the operation manner of the third operational circuit may be understood with reference to the description of the first operational circuit, which may not be repeatedly described here.

For the fourth operational circuit 322:

in some embodiments, the fourth operational circuit may include a plurality of first word lines, a plurality of second word lines, a first bit line, a second bit line, a sense amplifier, a word line control circuit, a plurality of first memory cells, and a plurality of second memory cells.

The word line control circuit is configured to control the level states of the plurality of first word lines according to the first data to obtain the level states of the plurality of first word lines.

The first bit line is configured to determine a level state of the first bit line according to the first data.

The plurality of first memory cells are configured to determine level states of the plurality of first memory cells according to the level states of the plurality of first word lines and the level state of the first bit line.

The word line control circuit is further configured to, after a target second word line is determined, change a level state of the target second word line, and control level states of remaining second word lines except the target second word line according to the second operation result to obtain the level states of the plurality of second word lines.

The second bit line is configured to determine the level state of the second bit line according to the second operation result.

The plurality of second memory cells are configured to determine level states of the plurality of second memory cells according to the level states of the plurality of second word lines and the level state of the second bit line.

The sense amplifier is configured to output the second operation result according to the level states of the plurality of first memory cells and the level states of the plurality of second memory cells.

In some embodiments, the word line control circuit is further configured to perform zero clearing processing on the plurality of first word lines, and perform zero clearing processing on the plurality of second word lines.

In some embodiments, the word line control circuit is configured to control the target second word line to be in the activated state after receiving a first activation instruction.

In some embodiments, the word line control circuit is further configured to, after receiving a second activation instruction, control at least two first word lines to be in the activated state if the first data is a first value, and control the plurality of first word lines to be in the inactivated state if the first data is a second value.

In some embodiments, the word line control circuit is further configured to, after receiving a third activation instruction, control at least two second word lines except the target second word line to be in the activated state if the second operation result is the first result value, and control the remaining second word lines except the target second word line to be in the inactivated state if the second data is the second result value.

In some embodiments, the sense amplifier is configured to, after receiving a preset comparison instruction, read first voltage provided by the plurality of first memory cells and second voltage provided by the plurality of second memory cells, and perform comparison operation on the first data and the second data according to the first voltage and the second voltage to output the second operation result.

If the first voltage is higher than the second voltage, the second operation result output by the sense amplifier is the first result value; or, if the first voltage is lower than the second voltage, the second operation result output by the sense amplifier is the second result value.

It is to be noted that an operation manner of the fourth operational circuit is identical to an operation manner of the second operational circuit, and the specific description of the operation manner of the fourth operational circuit may be understood with reference to the description of the second operational circuit, which may not be repeatedly described here.

It is also to be noted that, in the embodiment of the present disclosure, the level state of the word line is adjusted in relative high and low level states. In practical application, the change of the level state of each word line is not exactly the same, and does not completely follow the exemplary high and low states provided by the embodiment of the present disclosure. The level state is adjusted as long as the function of each operational circuit may be realized, which is not specifically limited in the embodiment of the present disclosure.

Figure 12:
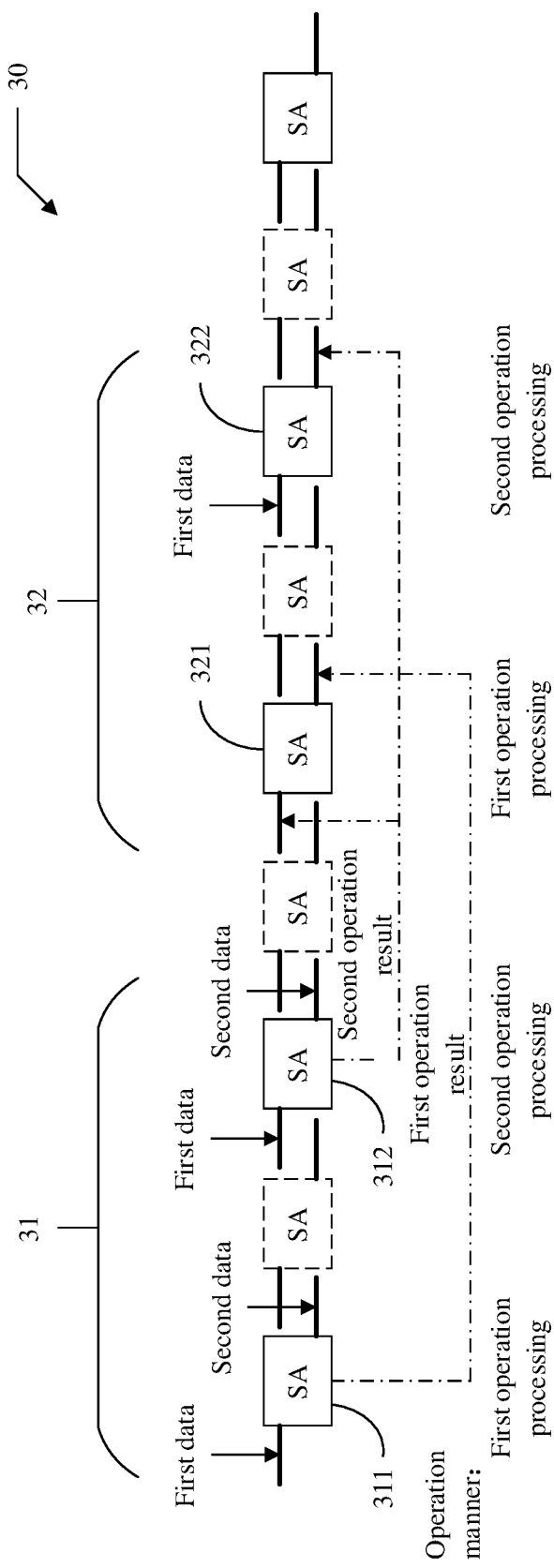
FIG. 12 is a first simplified schematic structural diagram of an in-memory computing circuit according to an embodiment of the present disclosure.

Further, referring to FIG. 12, which shows a first simplified schematic structural diagram of an in-memory computing circuit 30 according to an embodiment of the present disclosure. Herein, SA represents the Sense Amplifier in the operational circuit. In the initial computing circuit 31 and the target computing circuit 32, the solid line box shows the operational circuit in the in-memory computing circuit 30, and the dotted line box shows other circuits in the in-memory computing circuit configured to perform other functions of the circuit.

Figure 13:
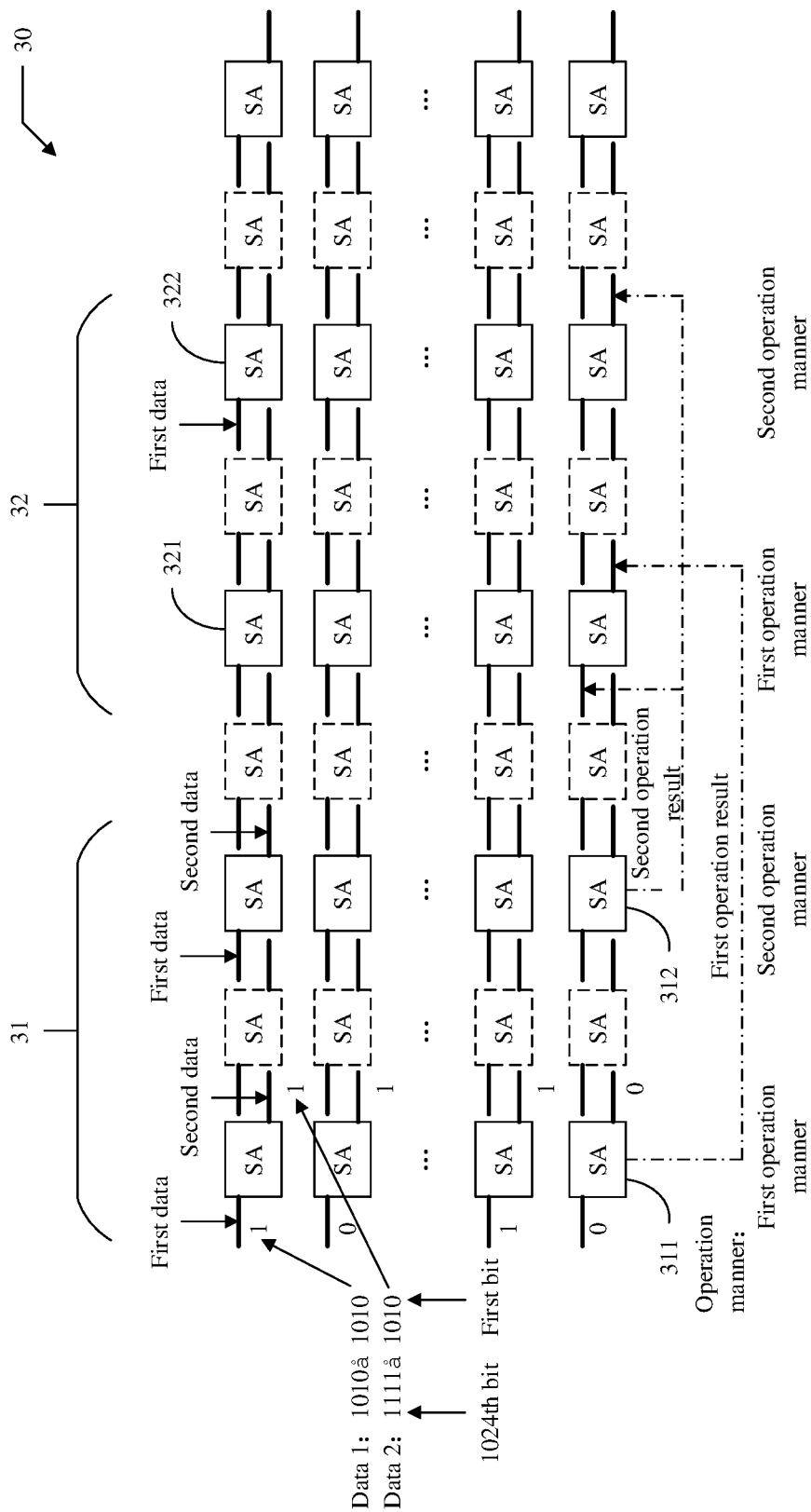
FIG. 13 is a second simplified schematic structural diagram of an in-memory computing circuit according to an embodiment of the present disclosure.

As shown in FIG. 13, for the first operational circuit 311 and the second operational circuit 312 included in the initial computing circuit 31, the first operational circuit 311 processes the first data and the second data according to the operation manner of first operation processing to obtain the first operation result.

The second operational circuit 312 processes the first data and the second data according to the operation manner of second operation processing to obtain the second operation result.

For the third operational circuit 321 and the fourth operational circuit 322 included in the target computing circuit 32, the third operational circuit 321 processes the second operation result and the first operation result according to the operation manner of first operation processing to obtain the first target result. The first target result is the result of XOR operation of the first data and the second data.

The fourth operational circuit 322 processes the first data and the second operation result according to the operation manner of second operation processing to obtain the second target result. The second target data is the result of AND operation of the first data and the second data.

Further, referring to FIG. 13, which shows a second simplified schematic structural diagram of an in-memory computing circuit 30 according to an embodiment of the present disclosure. As shown in FIG. 13, the in-memory computing circuit 30 may include a plurality of first operational circuits 311, a plurality of second operational circuits 312, a plurality of third operational circuits 321, and a plurality of fourth operational circuits 322.

As shown in FIG. 13, taking 8G 4th Dual Data Rate (DDR4) synchronous dynamic random access memory as an example, at least 1024 sense amplifiers operate when the word line is activated, so that 1024 bits may be added at the same time. Data 1 and data 2 are both 1024-bit binary numbers, data 1 provides the first data (summand), and data 2 provides the second data (addend). In the first row of the in-memory computing circuit 30, the first data is the number of the 1024th bit of data 1, that is, 1, and the second data is the number of the 1024th bit of data 2, that is, 1. In the second row of the in-memory computing circuit 30, the first data is the number of the 1023rd bit of data 1, that is, 0, and the second data is the number of the 1023rd bit of data 2, that is, 1. The same also applies to the intermediate rows. In the 1023rd row of the in-memory computing circuit 30, the first data is the number of the second bit of data 1, that is, 1, and the second data is the number of the second bit of data 2, that is, 1. In the 1024th row of the in-memory computing circuit 30, the first data is the number of the 1st bit of data 1, that is, 0, and the second data is the number of the 1st bit of data 2, that is, 0.

In this way, through computing of each row of operational circuits in the 1024 rows of the in-memory computing circuit 30, the result of XOR operation and the result of AND operation of the corresponding numbers of data 1 and data 2 at each bit may be finally obtained.

In the embodiment of the present disclosure, the in-memory computing circuit is implemented by means of storage devices such as a DRAM and a Static Random Access Memory (SRAM). Each of the DRAM and the SRAM includes a word line, a bit line, a memory cell, etc. By controlling the activation of the word line and comparing through the sense amplifier, the data operation may be realized. That is, the in-memory computing circuit 30 has the same structure as a common storage module, may be applied to a conventional storage module without changing the existing computer architecture, and has high feasibility and low implementation cost.

Figure 14:
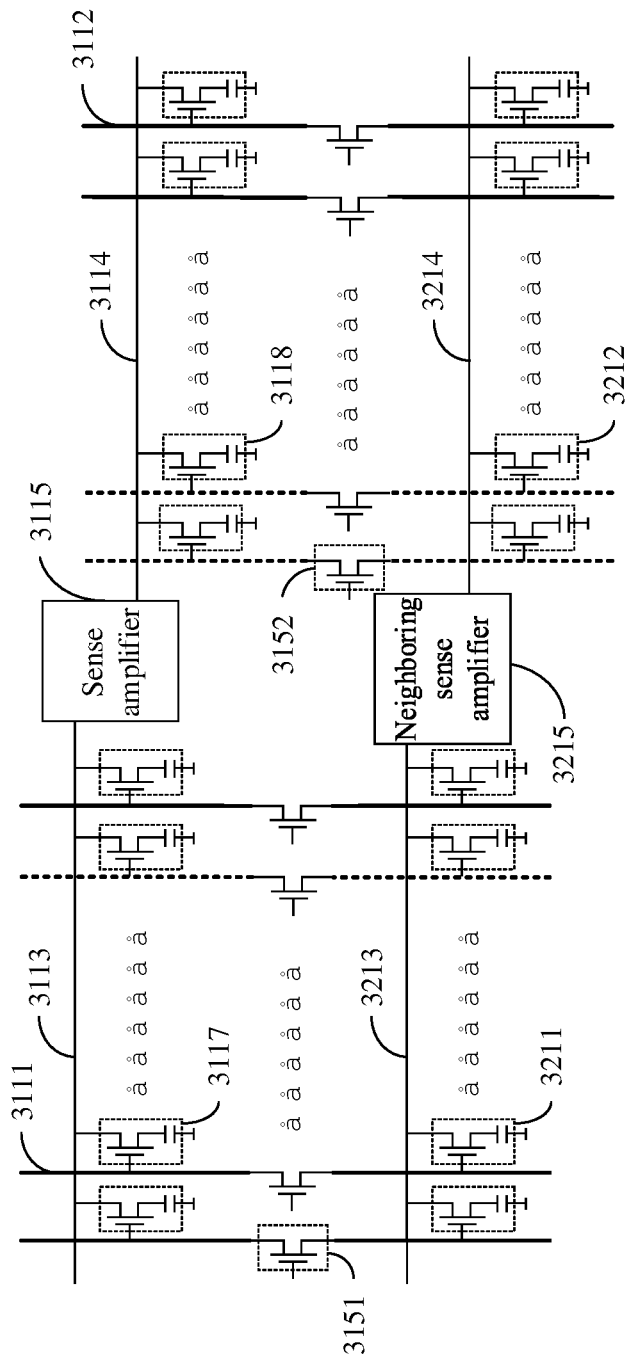
FIG. 14 is a schematic diagram of a circuit structure of an operational circuit according to an embodiment of the present disclosure.

Further, in some embodiments, referring to FIG. 14, which shows a schematic diagram of a circuit structure of an operational circuit according to an embodiment of the present disclosure. FIG. 14 may represent any one of the first operational circuit 311, the second operational circuit 312, the third operational circuit 321 and the fourth operational circuit 322. Here, the first operational circuit 311 is taken as an example.

As shown in FIG. 14, the first operational circuit 311 may further include a plurality of first neighboring memory cells 3211, a plurality of second neighboring memory cells 3212, a first neighboring bit line 3213, a second neighboring bit line 3214, and a neighboring sense amplifier 3215. The plurality of first neighboring memory cells 3211 are connected with the neighboring sense amplifier 3215 through the first neighboring bit line 3213, and the plurality of second neighboring memory cells 3212 are connected with the neighboring sense amplifier 3215 through the second neighboring bit line 3214.

That is, the first word line 3111 may be connected with not only one first memory cell 3117, but also one or more first neighboring memory cells 3211, and the second word line 3112 may be connected with not only one second memory cell 3118, but also one or more second neighboring memory cells 3212. That is, one first word line 3111 is connected with one first memory cell 3117 and at least one first neighboring memory cell 3211 at the same time. One second word line 3112 is connected with one second memory cell 3118 and at least one second neighboring memory cell 3212 at the same time.

In this case, if all the first word lines 3111/second word lines 3112 are turned on, data of other memory cells connected with the same word line may be destroyed. In order to solve this problem, in the embodiment of the present disclosure, an isolation transistor configured to isolate the memory cells may be arranged between two neighboring memory cells connected with the same word line, so as to prevent other data from being destroyed.

Exemplarily, the a-th first isolation transistor 3151 is arranged between the a-th first neighboring memory cell 3211 and the a-th first memory cell 3117 on the same first word line 3111. The b-th second isolation transistor 3152 is arranged between the b-th second neighboring memory cell 3212 and the b-th second memory cell 3118 on the same second word line 3112. Here, a and b are both positive integers.

In addition, the drain of the a-th first isolation transistor 3151 is connected with the gate of a transistor in the a-th first memory cell 3117 through the first word line 3111, and a source of the a-th first isolation transistor 3151 is connected with a gate of a transistor in the a-th first neighboring memory cell 3211 through the first word line 3111.

The drain of the b-th second isolation transistor 3152 is connected with the gate of a transistor in the b-th second memory cell 3118 through the second word line 3112, and the source of the b-th second isolation transistor 3152 is connected with the gate of a transistor in the b-th second neighboring memory cell 3212 through the second word line 3112.

By adding the isolation transistor between the two storages units in the neighboring locations, data in the neighboring memory cells may be prevented from being destroyed after all word lines are turned on. At the same time, when only part of the storage area is needed to store data, the storage area configured to store data from the storage area for operation are electrically isolated through the isolation transistor, and storage and operation of the storage area are realized at the same time, thereby improving the utilization rate of the device in the storage area.

In some embodiments, the in-memory computing circuit 30 implements at least one of the following operations: a half addition operation, a full addition operation, and a multiplication operation.

It is to be noted that, besides the half addition operation, the in-memory computing circuit 30 provided by the embodiments of the present disclosure may also implement the operations such as full addition operation and multiplication operation based on the same operation principle.

Figure 15:
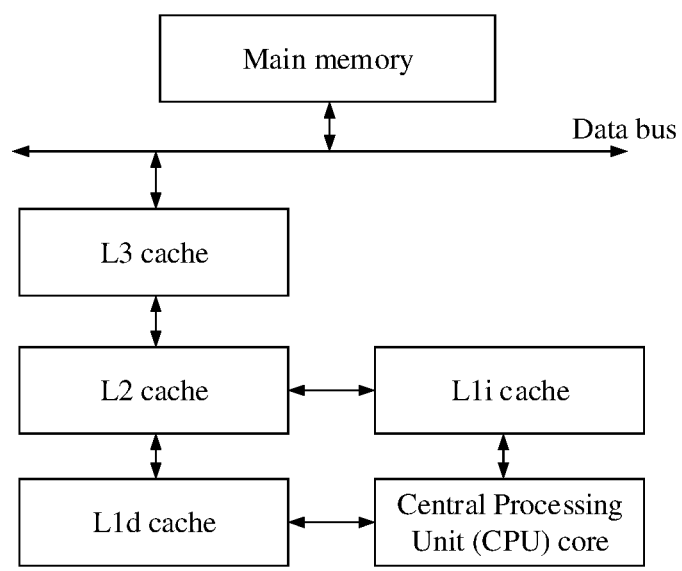
FIG. 15 is a schematic diagram of an architecture of a computing device according to an embodiment of the present disclosure.

Further, referring to FIG. 15, which shows a schematic diagram of an architecture of a computing device according to an embodiment of the present disclosure. As shown in FIG. 15, the architecture includes a Main Memory, a Level 3 (L3) Cache, a Level (L2) Cache, Level 1 Data Cache (L1d Cache), a Level 1 Instruction cache (L1i Cache), and a Central Processing Unit (CPU) Core. The main memory and the L3 cache are all connected with a data bus (Bus), and the connections of other modules may be seen in the figure. Table 6 shows the clock cycles needed to access several major locations.

TABLE 6

| Data destination | Needed clock cycle |
| --- | --- |
| Register | Smaller than or equal to 1 |
| L1d cache | About 3 |
| L2 cache | About 14 |
| Main memory | About 240 |

As shown in Table 6, each memory access ta es about 240 clock cycles. That is, if comparison operation needs to be performed on the data, the processor needs to access the memory multiple times to obtain the data, and then perform the comparison operation. However, in the embodiment of the present disclosure, operation processing is performed on the data using the memory, thereby saving the time for the processor to access the memory, that is, about "240*N−2" clock cycles may be saved each time when data comparison operation is performed using the memory. Herein, N is the access times.

In short, in the in-memory computing circuit provided by the embodiment of the present disclosure, for each operational circuit, when performing operation, the specified area in the memory (such as DRAM) is first cleared (data 0 is written), and 1 is prewritten into the specified bit line (target first bit line/target second bit line).

Then, the processor stores the data that needs to be added into the cleared area respectively. The data storage rule is that: for the first operational circuit and the second operational circuit, the first data (summand) is stored into the first area, and the second data (addend) is stored into the second area; and after the sense amplifier in the circuit operates, the first operation result may be obtained based on first operation processing, and the second operation result may be obtained based on second operation processing.

Then, the second operation result and the first operation result are input into the third operational circuit, and the first data and the second operation result are input into the fourth operational circuit. The data storage rule is that: for the third operational circuit, the second operation result is stored into the first area, and the first operation result is stored into the second area; and for the fourth operational circuit, the first data is stored into the first area, and the second operation result is stored into the second area. First operation processing is performed again to obtain the first target result, and second operation processing is performed again to obtain the second target result. Therefore, the XOR operation and the AND operation are realized to achieve the function of the half adder.

That is, in the embodiment of the present disclosure, the data that needs to use a large number of additions in a computer may be classified into the summand and the addend and stored into the memory, and then in the memory, a large number of addition operations may be achieved by activating the plurality of word lines and the action characteristics of the sense amplifier at the same time, which may greatly reduce the operation time and power consumption.

The embodiments of the present disclosure provide an in-memory computing circuit, which includes: an initial computing circuit and a target computing circuit. Herein, the initial computing circuit is configured to perform first operation processing on first data and second data to output a first operation result, and perform second operation processing on the first data and the second data to output a second operation result. The target computing circuit is configured to perform the first operation processing on the second operation result and the first operation result to output a first target result, and perform the second operation processing on the first data and the second operation result to output a second target result. In this way, the in-memory computing circuit performs twice first operation processing and twice second operation processing on the first data and the second data to obtain the result of XOR operation and the result of AND operation of the first data and the second data, and obtain the operation effect equivalent to that of the half adder, thereby improving the data processing speed through the in-memory computing circuit. In addition, the embodiments of the present disclosure may complete operation processing of data with the help of the memory cell, and does not need to transfer the data from the storage module to the processor and then perform operation using the processor, which improves the data processing speed and efficiency, and saves energy consumption. The in-memory computing circuit includes the memory cell and the sense amplifier, has the same structure as a common storage module, may be applied to a conventional storage module without changing the device structure of the existing memory, and has high feasibility and low implementation cost.

Figure 16:
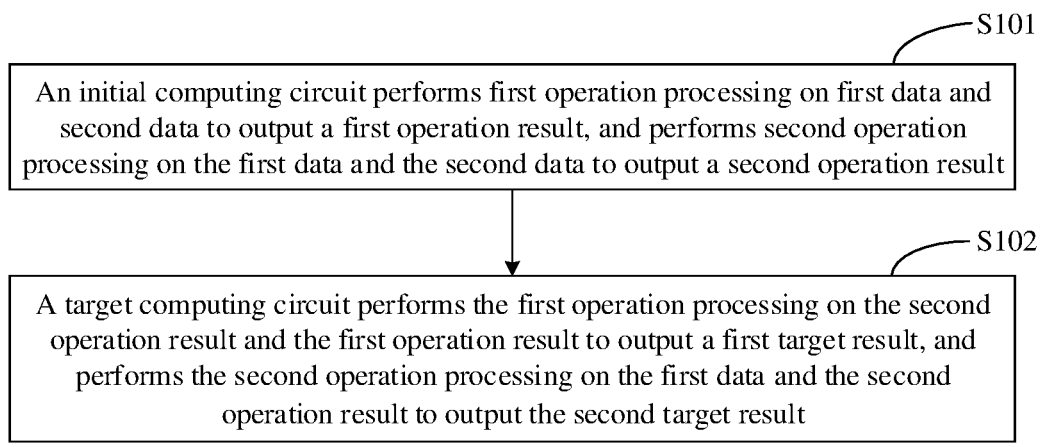
FIG. 16 is a flowchart of an in-memory computing method according to an embodiment of the present disclosure.

In another embodiment of the present disclosure, referring to FIG. 16, FIG. 16 shows a flowchart of an in-memory computing method according to an embodiment of the present disclosure. As shown in FIG. 16, the method may include the following steps.

At S101, an initial computing circuit performs first operation processing on first data and second data to output a first operation result, and performs second operation processing on the first data and the second data to output a second operation result.

At S102, the target computing circuit performs the first operation processing on the second operation result and the first operation result to output a first target result, and performs the second operation processing on the first data and the second operation result to output the second target result.

It is to be noted that the in-memory computing method is applied to the in-memory computing circuit 30 described in the above embodiments. Herein, the first target result is configured to indicate a result of XOR operation of the first data and the second data, and the second target result is configured to indicate a result of AND operation of the first data and the second data.

In some embodiments, the initial computing circuit may include a first operational circuit and a second operational circuit. The target computing circuit may include a third operational circuit and a fourth operational circuit.

The steps that the initial computing circuit performs first operation processing on first data and second data to output a first operation result, and performs second operation processing on the first data and the second data to output a second operation result may include the following steps.

The first operational circuit performs the first operation processing on the first data and the second data to output the first operation result.

The second operational circuit performs the second operation processing on the first data and the second data to output the second operation result.

The steps that the target computing circuit performs the first operation processing on the second operation result and the first operation result to output a first target result, and performs the second operation processing on the first data and the second operation result to output the second target result may include the following steps.

The third operational circuit performs the first operation processing on the second operation result and the first operation result to output the first target result. The fourth operational circuit performs the second operation processing on the first data and the second operation result to output the second target result.

It is to be noted that, in the embodiment of the present disclosure, an operation manner of the third operational circuit is identical to an operation manner of the first operational circuit, and an operation manner of the fourth operational circuit is identical to an operation manner of the second operational circuit.

Further, for the first operation result, in some embodiments, the first operational circuit may include a plurality of first word lines, a plurality of second word lines, a first bit line, a second bit line, a sense amplifier, a word line control circuit, a plurality of first memory cells, and a plurality of second memory cells.

The step that the first operational circuit performs the first operation processing on the first data and the second data to output the first operation result may include the following steps.

After a target first word line is determined, the word line control circuit changes a level state of the target first word line, and controls level states of remaining first word lines except the target first word line according to the first data to obtain the level states of the plurality of first word lines.

The word line control circuit controls level states of the plurality of second word lines according to the second data to obtain the level states of the plurality of second word lines.

The level state of the first bit line is determined according to the first data.

Level states of the plurality of first memory cells are determined according to the level states of the plurality of first word lines and the level state of the first bit line.

The level state of the second bit line is determined according to the second data.

Level states of the plurality of second memory cells are determined according to the level states of the plurality of second word lines and the level state of the second bit line.

The sense amplifier outputs the first operation result according to the level states of the plurality of first memory cells and the level states of the plurality of second memory cells.

In some embodiments, the step that the word line control circuit changes the level state of the target first word line may include the following steps.

The word line control circuit receives a first activation instruction, and controls the target first word line to be in an activated state.

In some embodiments, before the word line control circuit changes the level state of the target first word line, the method may further include the following steps.

The word line control circuit performs zero clearing processing on the plurality of first word lines.

The word line control circuit performs zero clearing processing on the plurality of second word lines.

In some embodiments, the step that level states of remaining first word lines except the target first word line are controlled according to the first data may include the following steps.

The word line control circuit receives a second activation instruction, controls at least two first word lines except the target first word line to be in the activated state if the first data is a first value, and controls the remaining first word lines except the target first word line to be in the inactivated state if the first data is a second value.

In some embodiments, the step that the level states of the plurality of second word lines are controlled according to the second data may include the following steps.

The word line control circuit receives a third activation instruction, controls at least two second word lines to be in the activated state if the second data is a first value, and controls the plurality of second word lines to be in the inactivated state if the second data is a second value.

In some embodiments, the step that the sense amplifier outputs the first operation result according to the level states of the plurality of first memory cells and the level states of the plurality of second memory cells may include the following steps.

After receiving a preset comparison instruction, the sense amplifier reads first voltage provided by the plurality of first memory cells and second voltage provided by the plurality of second memory cells, and performs comparison operation on the first data and the second data according to the first voltage and the second voltage to obtain the first operation result.

Herein, If the first voltage is higher than the second voltage, the first operation result output by the sense amplifier is a first result value; or, if the first voltage is lower than the second voltage, the first operation result output by the sense amplifier is a second result value.

Further, for the second operation result, in some embodiments, the second operational circuit may include a plurality of first word lines, a plurality of second word lines, a first bit line, a second bit line, a sense amplifier, a word line control circuit, a plurality of first memory cells, and a plurality of second memory cells.

The step that the second operational circuit performs the second operation processing on the first data and the second data to output the second operation result may include the following steps.

The word line control circuit controls level states of the plurality of first word lines according to the first data to obtain the level states of the plurality of first word lines.

After a target second word line is determined, the word line control circuit changes a level state of the target second word line, and controls level states of the remaining second word lines except the target second word line according to the second data to obtain the level states of the plurality of second word lines.

The level state of the first bit line is determined according to the first data.

Level states of the plurality of first memory cells are determined according to the level states of the plurality of first word lines and the level state of the first bit line.

The level state of the second bit line is determined according to the second data.

Level states of the plurality of second memory cells are determined according to the level states of the plurality of second word lines and the level state of the second bit line.

The sense amplifier outputs the second operation result according to the level states of the plurality of first memory cells and the level states of the plurality of second memory cells.

In some embodiments, the step that the word line control circuit changes the level state of the target second word line may include the following steps.

The word line control circuit receives the first activation instruction, and controls the target first word line to be in an activated state.

In some embodiments, before the word line control circuit changes the level state of the target second word line, the method may further include the following steps.

The word line control circuit performs zero clearing processing on the plurality of first word lines.

The word line control circuit performs zero clearing processing on the plurality of second word lines.

In some embodiments, the step that the level states of the plurality of first word lines are controlled according to the first data may include the following steps.

The word line control circuit receives the second activation instruction, controls at least two target first word lines to be in the activated state if the first data is the first value, and controls the plurality of first word lines to be in the inactivated state if the first data is the second value.

In some embodiments, the step that the level states of the remaining second word lines except the target second word line are controlled according to the second data may include the following steps.

The word line control circuit receives the third activation instruction, controls at least two second word lines except the target second word line to be in the activated state if the second data is a first value, and controls the remaining second word lines except the target second word line to be in the inactivated state if the second data is a second value.

In some embodiments, the step that the sense amplifier outputs the second operation result according to the level states of the plurality of first memory cells and the level states of the plurality of second memory cells may include the following steps.

After receiving the preset comparison instruction, the sense amplifier reads first voltage provided by the plurality of first memory cells and second voltage provided by the plurality of second memory cells, and performs comparison operation on the first data and the second data according to the first voltage and the second voltage to obtain the second operation result.

Herein, if the first voltage is higher than the second voltage, the second operation result output by the sense amplifier is the first result value; or, if the first voltage is lower than the second voltage, the second operation result output by the sense amplifier is the second result value.

Further, for the first operation result, in some embodiments, the third operational circuit may include a plurality of first word lines, a plurality of second word lines, a first bit line, a second bit line, a sense amplifier, a word line control circuit, a plurality of first memory cells, and a plurality of second memory cells.

The step that the third operational circuit performs the first operation processing on the second operation result and the first operation result to output the first target result may include the following steps.

After a target first word line is determined, the word line control circuit changes a level state of the target first word line, and controls level states of remaining first word lines except the target first word line according to the second operation result to obtain the level states of the plurality of first word lines.

The word line control circuit controls level states of the plurality of second word lines according to the first operation result to obtain the level states of the plurality of second word lines.

The level state of the first bit line is determined according to the second operation result.

Level states of the plurality of first memory cells are determined according to the level states of the plurality of first word lines and the level state of the first bit line.

The level state of the second bit line is determined according to the first operation result.

Level states of the plurality of second memory cells are determined according to the level states of the plurality of second word lines and the level state of the second bit line.

The sense amplifier outputs the first operation result according to the level states of the plurality of first memory cells and the level states of the plurality of second memory cells.

In some embodiments, the step that the word line control circuit changes the level state of the target first word line may include the following steps.

The word line control circuit receives the first activation instruction, and controls the target first word line to be in an activated state.

In some embodiments, before the word line control circuit changes the level state of the target first word line, the method may further include the following steps.

The word line control circuit performs zero clearing processing on the plurality of first word lines.

The word line control circuit performs zero clearing processing on the plurality of second word lines.

In some embodiments, the step that level states of remaining first word lines except the target first word line are controlled according to the second operation result may include the following steps.

The word line control circuit receives the second activation instruction, controls at least two first word lines except the target first word line to be in the activated state if the second operation result is the first result value, and controls the remaining first word lines except the target first word line to be in the inactivated state if the first operation result is the second result value.

In some embodiments, the step that the level states of the plurality of second word lines are controlled according to the first operation result may include the following steps.

The word line control circuit receives the third activation instruction, controls at least two second word lines to be in the activated state if the first operation result is the first result value, and controls the plurality of second word lines to be in the inactivated state if the first operation result is the second result value.

In some embodiments, the step that the sense amplifier outputs the first target result according to the level states of the plurality of first memory cells and the level states of the plurality of second memory cells may include the following steps.

After receiving the preset comparison instruction, the sense amplifier reads first voltage provided by the plurality of first memory cells and second voltage provided by the plurality of second memory cells, and performs comparison operation on the second operation result and the first operation result according to the first voltage and the second voltage to output the first target result.

Herein, if the first voltage is higher than the second voltage, the first target result output by the sense amplifier is the first result value; or, if the first voltage is lower than the second voltage, the first target result output by the sense amplifier is the second result value.

Further, for the second target result, in some embodiments, the fourth operational circuit may include a plurality of first word lines, a plurality of second word lines, a first bit line, a second bit line, a sense amplifier, a word line control circuit, a plurality of first memory cells, and a plurality of second memory cells.

The step that the fourth operational circuit performs the second operation processing on the first data and the second operation result to output the second target result may include the following steps.

The level states of the plurality of first word lines are controlled according to the first data to obtain the level states of the plurality of first word lines.

After a target second word line is determined, the word line control circuit changes a level state of the target second word line, and controls level states of remaining second word lines except the target second word line according to the second operation result to obtain the level states of the plurality of second word lines.

The level state of the first bit line is determined according to the first data.

Level states of the plurality of first memory cells are determined according to the level states of the plurality of first word lines and the level state of the first bit line.

The level state of the second bit line is determined according to the second operation result.

Level states of the plurality of second memory cells are determined according to the level states of the plurality of second word lines and the level state of the second bit line.

The sense amplifier outputs the second operation result according to the level states of the plurality of first memory cells and the level states of the plurality of second memory cells.

In some embodiments, the step that the word line control circuit changes the level state of the target second word line may include the following steps.

The word line control circuit receives the first activation instruction, and controls the target first word line to be in the activated state.

In some embodiments, before the word line control circuit changes the level state of the target second word line, the method may further include the following steps.

The word line control circuit performs zero clearing processing on the plurality of first word lines.

The word line control circuit performs zero clearing processing on the plurality of second word lines.

In some embodiments, the step that the level states of the plurality of first word lines are controlled according to the first data may include the following steps.

The word line control circuit receives the second activation instruction, controls at least two target first word lines to be in the activated state if the first data is a first value, and controls the plurality of first word lines to be in the inactivated state if the first data is a second value.

In some embodiments, the step that the level states of the remaining second word lines except the target second word line are controlled according to the second operation result may include the following steps.

The word line control circuit receives the third activation instruction, controls at least two second word lines except the target second word line to be in the activated state if the second operation result is a first result value, and controls the remaining second word lines except the target second word line to be in the inactivated state if the second data is a second value.

In some embodiments, the step that the sense amplifier outputs the second operation result according to the level states of the plurality of first memory cells and the level states of the plurality of second memory cells may include the following steps.

After receiving the preset comparison instruction, the sense amplifier reads first voltage provided by the plurality of first memory cells and second voltage provided by the plurality of second memory cells, and performs comparison operation on the first data and the second data according to the first voltage and the second voltage to output the second target result.

Herein, if the first voltage is higher than the second voltage, the second target result output by the sense amplifier is the first result value; or, if the first voltage is lower than the second voltage, the second target result output by the sense amplifier is the second result value.

It is to be noted that undisclosed details in the embodiments of the method may be understood with reference to the descriptions of the above embodiments.

According to the in-memory computing method in the embodiments of the present disclosure, the initial computing circuit performs the first operation processing on first data and second data to output the first operation result, and performs the second operation processing on the first data and the second data to output the second operation result. The target computing circuit performs the first operation processing on the second operation result and the first operation result to output the first target result, and performs the second operation processing on the first data and the second operation result to output the second target result. In this way, by performing twice first operation processing and twice second operation processing on the first data and the second data, the result of XOR operation and the result of AND operation of the first data and the second data may be obtained, and the operation effect equivalent to that of the half adder is obtained, thereby improving the data processing speed.

Figure 17:
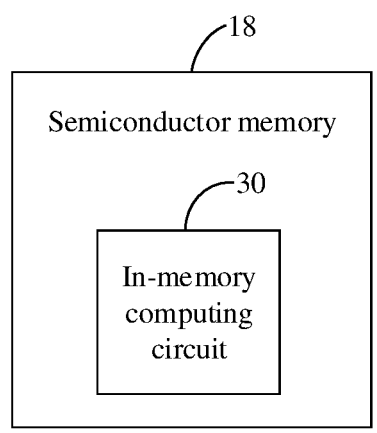
FIG. 17 is a schematic diagram of a composition structure of a semiconductor memory according to an embodiment of the present disclosure.

In yet another embodiment of the present disclosure, referring to FIG. 17, which shows a schematic diagram of a composition structure of a semiconductor memory 18 according to an embodiment of the present disclosure. As shown in FIG. 17, the semiconductor memory 18 includes at least the in-memory computing circuit 30 of any one of the above embodiments.

In some embodiments, the semiconductor memory is a DRAM chip.

Since the semiconductor memory 18 includes the in-memory computing circuit 30 described in any one of the above embodiments, the in-memory computing circuit may perform twice first operation processing and twice second operation processing on the first data and the second data to obtain the result of XOR operation and the result of AND operation of the first data and the second data through the in-memory computing circuit, and obtain the operation effect equivalent to that of the half adder, thereby improving the data processing speed through the in-memory computing circuit.

The above are only the preferred embodiments of the present disclosure, and are not intended to limit the scope of protection of the present disclosure.

It is to be noted that in this disclosure, the terms "including", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element.

The above numbers of the embodiments of the present disclosure are only for description, and do not represent the advantages or disadvantages of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiment. The features disclosed in several method or device embodiments provided in the present disclosure may be combined arbitrarily without conflict to obtain new method embodiments or device embodiments.

The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subject to the scope of protection of the claims.

The embodiments of the present disclosure provide an in-memory computing circuit and method, and a semiconductor memory. The in-memory computing circuit includes: an initial computing circuit and a target computing circuit. Herein, the initial computing circuit is configured to perform first operation processing on first data and second data to output a first operation result, and perform second operation processing on the first data and the second data to output a second operation result. The target computing circuit is configured to perform the first operation processing on the second operation result and the first operation result to output a first target result, and perform the second operation processing on the first data and the second operation result to output a second target result. Herein, the first target result is configured to indicate a result of XOR operation of the first data and the second data, and the second target result is configured to indicate a result of AND operation of the first data and the second data. In this way, the in-memory computing circuit performs twice first operation processing and twice second operation processing on the first data and the second data to obtain the result of XOR operation and the result of AND operation of the first data and the second data, and obtain the operation effect equivalent to that of the half adder, thereby improving the data processing speed through the in-memory computing circuit.

What is claimed is:

1. An in-memory computing circuit, comprising:
an initial computing circuit, configured to perform first operation processing on first data and second data to output a first operation result, and perform second operation processing on the first data and the second data to output a second operation result; and
a target computing circuit, configured to perform the first operation processing on the second operation result and the first operation result to output a first target result, and perform the second operation processing on the first data and the second operation result to output a second target result; wherein
the initial computing circuit comprises a first operational circuit and a second operational circuit,
the first operational circuit is configured to perform the first operation processing on the first data and the second data to output the first operation result; and
the second operational circuit is configured to perform the second operation processing on the first data and the second data to output the second operation result.

2. The in-memory computing circuit of claim 1, wherein the first operational circuit comprises a plurality of first word lines, a plurality of second word lines, a first bit line, a second bit line, a sense amplifier, a word line control circuit, a plurality of first memory cells and a plurality of second memory cells,
wherein the word line control circuit is configured to, after a target first word line is determined, change a level state of the target first word line, and control level states of remaining first word lines except the target first word line according to the first data to obtain the level states of the plurality of first word lines;
the first bit line is configured to determine a level state of the first bit line according to the first data;
the plurality of first memory cells are configured to determine level states of the plurality of first memory cells according to the level states of the plurality of first word lines and the level state of the first bit line;

the word line control circuit is further configured to control level states of the plurality of second word lines according to the second data to obtain the level states of the plurality of second word lines;
the second bit line is configured to determine a level state of the second bit line according to the second data;
the plurality of second memory cells are configured to determine level states of the plurality of second memory cells according to the level states of the plurality of second word lines and the level state of the second bit line; and
the sense amplifier is configured to output the first operation result according to the level states of the plurality of first memory cells and the level states of the plurality of second memory cells.

3. The in-memory computing circuit of claim 2, wherein:
the word line control circuit is configured to control the target first word line to be in an activated state after receiving a first activation instruction.

4. The in-memory computing circuit of claim 3, wherein:
the word line control circuit is further configured to, after receiving a second activation instruction, control at least two first word lines except the target first word line to be in the activated state if the first data is a first value, and control the remaining first word lines except the target first word line to be in an inactivated state if the first data is a second value.

5. The in-memory computing circuit of claim 3, wherein:
the word line control circuit is further configured to, after receiving a third activation instruction, control at least two second word lines to be in the activated state if the second data is a first value, and control the plurality of second word lines to be in an inactivated state if the second data is a second value.

6. The in-memory computing circuit of claim 2, wherein:
the sense amplifier is configured to, after receiving a preset comparison instruction, read first voltage provided by the plurality of first memory cells and second voltage provided by the plurality of second memory cells, and perform comparison operation on the first data and the second data according to the first voltage and the second voltage to output the first operation result,
wherein if the first voltage is higher than the second voltage, the first operation result output by the sense amplifier is a first result value; or, if the first voltage is lower than the second voltage, the first operation result output by the sense amplifier is a second result value.

7. The in-memory computing circuit of claim 1, wherein the second operational circuit comprises a plurality of first word lines, a plurality of second word lines, a first bit line, a second bit line, a sense amplifier, a word line control circuit, a plurality of first memory cells and a plurality of second memory cells,
wherein the word line control circuit is configured to control level states of the plurality of first word lines according to the first data to obtain the level states of the plurality of first word lines;
the first bit line is configured to determine a level state of the first bit line according to the first data;
the plurality of first memory cells are configured to determine level states of the plurality of first memory cells according to the level states of the plurality of first word lines and the level state of the first bit line;
the word line control circuit is further configured to, after a target second word line is determined, change a level state of the target second word line, and control level states of remaining second word lines except the target second word line according to the second data to obtain the level states of the plurality of second word lines;

the second bit line is configured to determine a level state of the second bit line according to the second data;

the plurality of second memory cells are configured to determine level states of the plurality of second memory cells according to the level states of the plurality of second word lines and the level state of the second bit line; and the sense amplifier is configured to output the second operation result according to the level states of the plurality of first memory cells and the level states of the plurality of second memory cells.

8. The in-memory computing circuit of claim 7, wherein:
the word line control circuit is configured to control the target second word line to be in an activated state after receiving a first activation instruction.

9. The in-memory computing circuit of claim 8, wherein:
the word line control circuit is further configured to, after receiving a second activation instruction, control at least two first word lines to be in the activated state if the first data is a first value, and control the plurality of first word lines to be in the inactivated state if the first data is a second value.

10. The in-memory computing circuit of claim 8, wherein:
the word line control circuit is further configured to, after receiving a third activation instruction, control at least two second word lines except the target second word line to be in the activated state if the second data is a first value, and control the remaining second word lines except the target second word line to be in an inactivated state if the second data is a second value.

11. The in-memory computing circuit of claim 7, wherein:
the sense amplifier is configured to, after receiving a preset comparison instruction, read first voltage provided by the plurality of first memory cells and second voltage provided by the plurality of second memory cells, and perform comparison operation on the first data and the second data according to the first voltage and the second voltage to output the second operation result,
wherein if the first voltage is higher than the second voltage, the second operation result output by the sense amplifier is a first result value; or, if the first voltage is lower than the second voltage, the second operation result output by the sense amplifier is a second result value.

12. The in-memory computing circuit of claim 1, wherein
the target computing circuit comprises a third operational circuit and a fourth operational circuit,
wherein the third operational circuit is configured to perform the first operation processing on the second operation result and the first operation result to output the first target result; and
the fourth operational circuit is configured to perform the second operation processing on the first data and the second operation result to output the second target result.

13. The in-memory computing circuit of claim 12, wherein
an operation manner of the third operational circuit is identical to an operation manner of the first operational circuit, and an operation manner of the fourth operational circuit is identical to an operation manner of the second operational circuit.

14. The in-memory computing circuit of claim 1, wherein
the in-memory computing circuit implements at least one of the following operations: a half addition operation, a full addition operation, and a multiplication operation.

15. The in-memory computing circuit of claim 1, wherein
the first target result is configured to indicate a result of XOR operation of the first data and the second data, and the second target result is configured to indicate a result of AND operation of the first data and the second data.

16. An in-memory computing method, applied to an in-memory computing circuit comprising an initial computing circuit and a target computing circuit, the method comprising:
performing, by the initial computing circuit, first operation processing on first data and second data to output a first operation result, and performing second operation processing on the first data and the second data to output a second operation result; and
performing, by the target computing circuit, the first operation processing on the second operation result and the first operation result to output a first target result, and performing the second operation processing on the first data and the second operation result to output a second target result; wherein
the initial computing circuit comprises a first operational circuit and a second operational circuit, and the target computing circuit comprises a third operational circuit and a fourth operational circuit;
the performing, by the initial computing circuit, first operation processing on first data and second data to output a first operation result, and performing second operation processing on the first data and the second data to output a second operation result comprise:
performing, by the first operational circuit, the first operation processing on the first data and the second data to output the first operation result; and
performing, by the second operational circuit, the second operation processing on the first data and the second data to output the second operation result;
the performing, by the target computing circuit, the first operation processing on the second operation result and the first operation result to output a first target result, and performing the second operation processing on the first data and the second operation result to output the second target result comprise:
performing, by the third operational circuit, the first operation processing on the second operation result and the first operation result to output the first target result; and performing, by the fourth operational circuit, the second operation processing on the first data and the second operation result to output the second target result.

17. The method of claim 16, wherein
an operation manner of the third operational circuit is identical to an operation manner of the first operational circuit, and an operation manner of the fourth operational circuit is identical to an operation manner of the second operational circuit.

18. A semiconductor memory, comprising the in-memory computing circuit of claim 1.

* * * * *